(12) United States Patent
Son et al.

(10) Patent No.: US 8,357,484 B2
(45) Date of Patent: Jan. 22, 2013

(54) MULTILAYER DRY FILM RESIST, METHOD OF MANUFACTURING THE RESIST, AND METHOD OF MANUFACTURING DISPLAY PLATE FOR LIQUID CRYSTAL DISPLAY PANEL USING THE RESIST

(75) Inventors: Kyoung-keun Son, Suwon-si (KR); Min Kang, Seoul (KR); Byoung-joo Kim, Anyang-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 882 days.

(21) Appl. No.: 11/739,178

(22) Filed: Apr. 24, 2007

(65) Prior Publication Data

US 2008/0044761 A1 Feb. 21, 2008

(30) Foreign Application Priority Data

Jun. 22, 2006 (KR) .................. 10-2006-0056426

(51) Int. Cl.
G03F 7/00 (2006.01)
G03F 1/00 (2012.01)
H01L 21/00 (2006.01)

(52) U.S. Cl. ....................... 430/311; 430/319

(58) Field of Classification Search .............. 430/20, 430/270.1, 311, 320, 303, 49.2, 319; 156/265
See application file for complete search history.

(56) References Cited

U.S. PATENT DOCUMENTS

2005/0266335 A1 * 12/2005 Johnson et al. .......... 430/270.1
2007/0090421 A1 *  4/2007 Jung ........................ 257/291

FOREIGN PATENT DOCUMENTS

| JP | 2005-303076 | 10/2005 |
| KR | 1020040105351 | 12/2004 |
| KR | 10-2005-0068507 | 7/2005 |

OTHER PUBLICATIONS

English Abstract for Publication No. 1020040105351.
English Abstract for Publication No. 1020050068507.
English Abstract for Publication No. 2005-303076.

* cited by examiner

*Primary Examiner* — Cynthia Kelly
*Assistant Examiner* — Connie P Johnson
(74) *Attorney, Agent, or Firm* — F. Chau & Associates, LLC

(57) ABSTRACT

A multilayer dry film resist includes two or more organic films which can be patterned; the multilayer dry film resist includes a base substrate, a first organic film disposed on the base substrate, and a second organic film disposed on the first organic film and including a photosensitizer.

10 Claims, 16 Drawing Sheets

MULTILAYER DRY FILM RESIST, METHOD OF MANUFACTURING THE RESIST, AND METHOD OF MANUFACTURING DISPLAY PLATE FOR LIQUID CRYSTAL DISPLAY PANEL USING THE RESIST

CROSS-REFERENCE TO RELATED PATENT APPLICATION

This application claims priority from Korean Patent Application No. 10-2006-0056426, filed on Jun. 22, 2006 in the Korean intellectual Property Office, the disclosure of which is incorporated herein by reference in its entirety.

BACKGROUND OF THE INVENTION

1. Field of the Invention

The present invention relates to a multilayer dry film resist, and more particularly, to a multilayer dry film resist including two or more different organic films which can be patterned, a method of manufacturing the resist, and a method of manufacturing a display plate for a liquid crystal display panel using the resist.

2. Description of Related Art

Typically, liquid crystal displays include two display plates facing each other and a liquid crystal layer interposed between the two display plates. Each display plate uses a transparent insulating substrate as a support substrate. A plurality of thin film patterns are formed on the insulating substrate.

According to a conventional method of forming a thin film pattern, a material is deposited and the material layer is patterned by photolithography. In detail, a photoresist is coated on the material layer, exposed to light using a mask, and developed to form a photoresist pattern. Then, the material layer is patterned using the photoresist pattern as an etching mask. Alternatively, a material layer including a photosensitizer may be patterned by exposure and development without forming a photoresist pattern.

In the above-described photolithographic patterning method, materials including the photoresist and the photosensitizer are supplied in a liquid phase. Thus, these materials are coated using a spin-coating process or the like, dried, and baked. Implementing such a coating process includes the use of expensive coating equipment, and the planarity of a coated material layer may be compromised for certain coating methods. Furthermore, the dry and bake processes after the coating increase an entire process duration. In addition, during a bake process involved in a photolithography process, coating materials may cause stress to a substrate, thereby altering an insulating substrate or a material constituting a thin film formed on the substrate.

SUMMARY OF THE INVENTION

According to an exemplary embodiment of the present invention, a multilayer dry film resist includes a base substrate, a first organic film disposed on the base substrate, including a photosensitizer, and a second organic film disposed on the first organic film.

According to another exemplary embodiment of the present invention, a method of manufacturing a multilayer dry film resist includes providing a first dry film in which a first organic film comprising a photosensitizer is formed on a first base substrate and a second dry film in which a second organic film is formed on a second base substrate, and placing and laminating the second dry film on the first dry film so that the second organic film faces the first organic film.

According to still another exemplary embodiment of the present invention, a method of manufacturing a display plate for a liquid crystal display panel includes forming a passivation layer on an insulating substrate on which a plurality of thin film transistors are arranged, each thin film transistor comprising a gate electrode, a semiconductor layer, a source electrode, and a drain electrode, placing and laminating on the passivation layer a multilayer dry film resist comprising a base substrate, a first organic film formed on the base substrate, and a second organic film formed on the first organic film so that the second organic film faces the passivation layer, removing the base substrate, and patterning the first organic film and the second organic film.

According to yet another exemplary embodiment of the present invention, a method of manufacturing a display plate for a liquid crystal display panel includes forming a passivation layer on an insulating substrate on which a plurality of thin film transistors are arranged, each thin film transistor comprising a gate electrode, a semiconductor layer, a source electrode, and a drain electrode, placing and laminating on the passivation layer a multilayer dry film resist comprising a base substrate, a first organic film formed on the base substrate, a second organic film formed on the first organic film, and a third organic film formed on the second organic film so that the third organic film faces the passivation layer, removing the base substrate, and patterning the first organic film, the second organic film, and the third organic film.

According to yet another exemplary embodiment of the present invention, a method of manufacturing a display plate for a liquid crystal display panel includes placing and laminating on an insulating substrate a multilayer dry film resist comprising a base substrate, a first organic film formed on the base substrate, and a second organic film formed on the first organic film so that the second organic film faces the insulating substrate, removing the base substrate, and patterning the first organic film.

BRIEF DESCRIPTION OF THE DRAWINGS

The present invention will become more apparent by describing in detail exemplary embodiments thereof with reference to the attached drawings, in which.

DETAILED DESCRIPTION OF PREFERRED EMBODIMENTS

Figure 1:
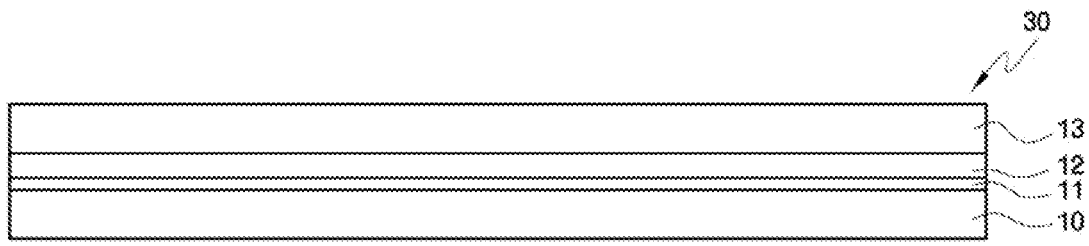
FIG. 1 is a sectional view illustrating a multilayer dry film resist according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to embodiments set forth herein. Rather, embodiments are provided so that this disclosure will be thorough and complete and will fully convey the concept of the invention to those skilled in the art, and the present invention will only be defined by the appended claims.

In the following description, it will be understood that when an element or a layer is referred to as being "on" another element or layer, it can be directly on the other element or layer, or intervening layers or elements may also be present. In contrast, when an element is referred to as being "directly on" another element, there are no intervening elements present. Like reference numerals refer to like elements throughout the specification. Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

A multilayer dry film resist according to the present invention will now be described more fully with reference to the accompanying drawings, in which exemplary embodiments of the invention are shown.

FIG. 1 is a sectional view illustrating a multilayer dry film resist according to an embodiment of the present invention.

Referring to FIG. 1, a multilayer dry film resist 30 includes a base substrate 10, a first organic film 11 disposed on the base substrate 10, and a second organic film 12 disposed on the first organic film 11.

The base substrate 10 may be made of any material capable of supporting an organic, film. The base substrate 10 may be made of a flexible material to enable the multilayer dry film resist 30 to be made and/or stored in a roll shape for facilitating a manufacturing process or the sequence of deposition on a substrate, as will be described later. Examples of the base substrate 10 include polymethyl methacrylate (PMMA), polycarbonate (PC), polyethylene (PE), and polyethylene terephthalate (PET). In view of the manufacturing process and cost, PET is preferably used.

The first organic film 11 is formed on the base substrate 10 using a coating process. The first organic film 11 includes a first organic material and may include a photosensitizer.

The second organic film 12 is deposited on the first organic film using a lamination or coating process. The second organic film 12 includes a second organic material and may include a photosensitizer.

The first organic material and the second organic material can be appropriately selected according to a structure of the multilayer dry film resist 30. For example, when the first organic film 11 is applied as a spacer of a liquid crystal display panel and a second organic film 12 is applied as an organic insulating layer, the first organic material may be an elastic organic material for the spacer, and the second organic material may be an organic material for the organic insulating layer.

The photosensitizer may be included in the first organic film 11 and/or the second organic film 12. The photosensitizer may be a Photo Acid Generator (PAG), for generating hydrogen ions in response to light (UV light) irradiation and transforming an organic material structure of an exposure area into a structure which can be dissolved in a developer.

The first organic film 11 and/or the second organic film 12 may further include other additives according to a structure to be manufactured or process to be applied. For example, when the first organic film 11 is applied as a black matrix, the first organic film 11 may need a black color. For this purpose, the first organic film 11 may further include carbon black. When the first organic film 11 and/or the second organic film 12 are patterned using a negative type process, the first organic film 11 and/or the second organic film 12 may further include a crosslinker.

When the first organic film 11 and/or the second organic film 12 are applied as overcoating layers, no patterning is needed and thus a photosensitizer may not be used.

The multilayer dry film resist 30 may further include a cover substrate 13 covering the second organic film 12. Examples of the cover substrate 13 include polymethyl methacrylate (PMMA), polycarbonate (PC), polyethylene (PE), and polyethylene terephthalate (PET). Preferably, the cover substrate 13 is made of polyethylene (PE). The cover substrate 13 may be the same as the base substrate 10 according to an application process.

When the multilayer dry film resist 30 is deposited on a substrate, separation of the base substrate 10 from the first organic film 11 and/or separation of the second organic film 12 from the cover substrate 13 is sometimes needed. Thus, it is preferred that the base substrate 10 and the cover substrate 13 are separable from the first organic film 11 and the second organic film 12. That is, it is preferred that a binding force between the base substrate 10 and the first organic film 11 and between the second organic film 12 and the cover substrate 13 is smaller than that between the first organic film 11 and the second organic film 12. For this purpose, a coating surface reducing a binding force may be disposed on a surface of the base substrate 10 contacting with the first organic film 11 and/or a surface of the cover substrate 13 contacting with the second organic film 12.

Figure 2:
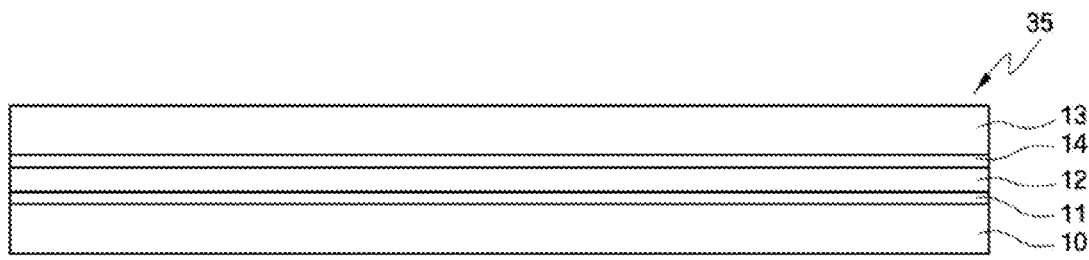
FIG. 2 is a sectional view illustrating a multilayer dry film resist according to another embodiment of the present invention.

FIG. 2 is a sectional view illustrating a multilayer dry film resist according to another embodiment of the present invention.

Referring to FIG. 2, a multilayer dry film resist 35 according to another embodiment of the present invention is substantially the same as the previous embodiment of the present invention, and further includes a third organic film 14 on the second organic film 12. The third organic film 14 includes a third organic material, and may include a photosensitizer.

Although not shown, according to some other embodiments of the present invention, the third organic film 14 may be interposed between the base substrate 10 and the first organic film 11 or between the first organic film 11 and the second organic film 12. In addition to the third organic film 14, still other organic films, e.g., a forth organic film (not shown) and a fifth organic film (not shown), can be included in the same manner as above according to various deposition sequences.

Hereinafter, methods of manufacturing multilayer dry film resists as described above will be described. In a case where the structures and materials of intermediate structures, which will be described later, are the same as or can be easily understood from those of the above-described multilayer dry film resists, overlapping descriptions will be omitted or simplified.

Figure 3A:
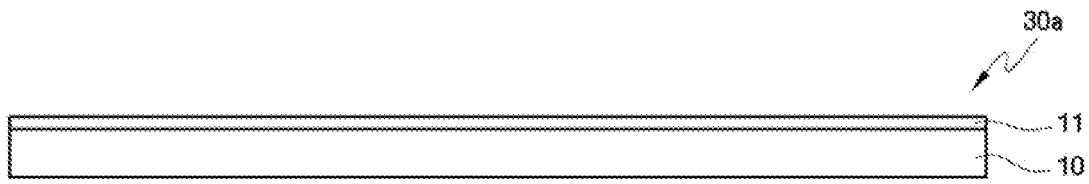
FIGS. 3A through 5 are sequential sectional views illustrating a method of manufacturing a multilayer dry film resist according to an embodiment of the present invention.

FIGS. 3A through 5 are sequential sectional views illustrating a method of manufacturing a multilayer dry film resist according to an embodiment of the present, invention. Referring to FIG. 3A, a first organic film 11 is formed on a base substrate 10. For example, the first organic film 11 is formed as follows. A first organic composition in a liquid phase including a first organic material, a photosensitizer, and a solvent is coated on the base substrate 11 using spin-coating, slit-coating, or the like. Then, the coated first organic composition is dried to complete a first dry film 30a.

According to some embodiments of the present invention, the drying of the first organic composition is performed using a heat treatment chamber, e.g., an oven. The heat treatment may be performed at a temperature of about 70 to 130° C. (Celsius) for about 10 to 30 minutes. Here, there is no need to cure the first organic composition to the degree of curing needed in exposure and development. The heat treatment is sufficient provided that a solvent of the first organic composition can be removed. Thus, unlike in a curing process, there is no need to perform a vacuum dry process and a bake process. A solvent can be removed by heat treatment in a heat treatment chamber. Therefore, a coating process is simplified.

According to some other embodiments of the present invention, the drying of the first organic composition can be performed using a hot plate or an infrared lamp, instead of using the above-described heat treatment chamber. In this case, processes can be continuously performed on a transfer line without suspending the process, thereby further improving process efficiency.

Figure 3B:
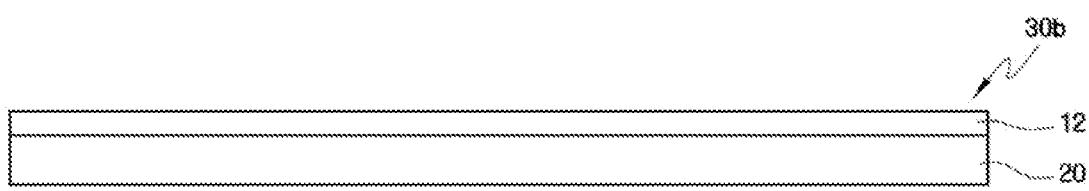

Referring to FIG. 3B, a second dry film 30b is manufactured simultaneously with or separately from the first dry film 30a shown in FIG. 3A. That is, a second organic film 12 is formed on a second base substrate 20 and dried to complete the second dry film 30b. The manufacture of the second dry film 30b is performed in substantially the same manner as the manufacture of the first dry film 30a except that a second organic composition in a liquid phase including a second organic material, a photosensitizer, and a solvent is used.

The second dry film 30b is laminated on the first dry film 30a using a laminator.

Figure 4:
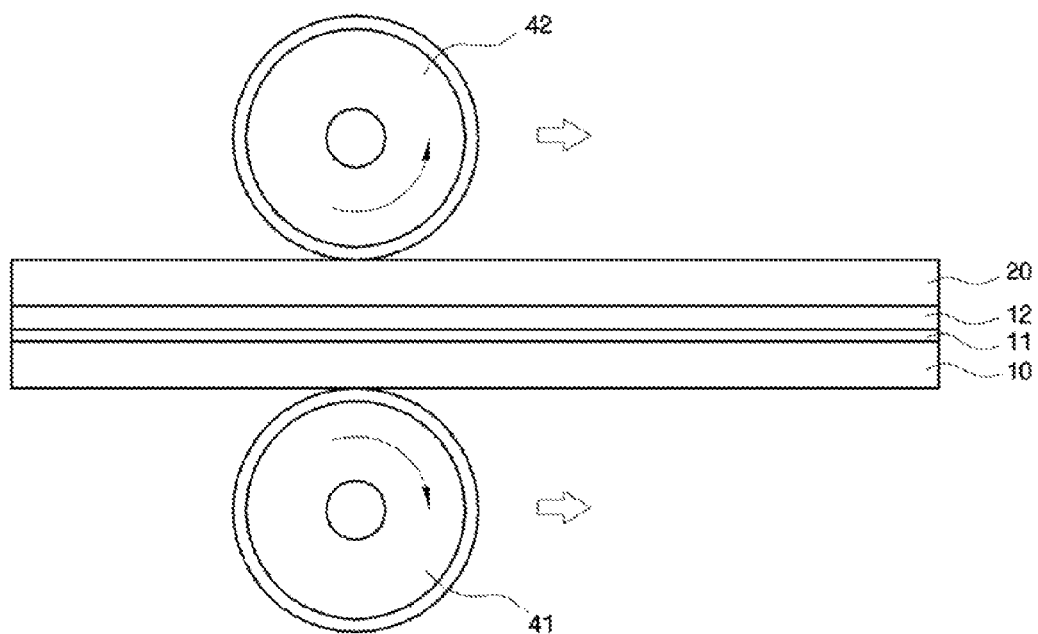

Referring to FIG. 4, according to some embodiments of the present invention, the lamination is performed using a laminator including a pressing unit. The pressing unit may include, for example, a first pressing roller 41 and a second pressing roller 42.

The lamination of the second dry film 30b on the first dry film 30a using the laminator can be performed as follows. The second dry film 30b is disposed on the first dry film 30a so that the first organic film 11 of the first dry film 30a faces the second organic film 12 of the second dry film 30b. In this state, the first dry film 30a and the second dry film 30b are allowed to pass through a space between the first pressing roller 41 and the second pressing roller 42. In detail, the first and second pressing rollers 41 and 42 may roll along the first and second dry films 30a and 30b to press the first and second dry films 30a and 30b, wherein the first and second dry films 30a and 30b are fixed. Alternatively, the first and second dry films 30a and 30b may pass through the space between the first, and second pressing rollers 41 and 42 in a state wherein the first and second pressing rollers 41 and 42 are fixed. Here, the rolling speeds of the first and second pressing rollers 41 and 42 may be substantially the same as the speed at which the first and second dry films 30a and 30b move relative to the first and second pressing rollers 41 and 42.

For example, the rolling speeds of the first and second pressing rollers 41 and 42 or the movement, speed of the first and second dry films 30a and 30b relative to the first and second pressing rollers 41 and 42 may be about 0.1 to 2 cm/s (centimeter per second), and preferably 0.7 to 0.9 cm/s for the supply of a sufficient pressing power.

A pressure applied to the first and second dry films 30a and 30b when they pass through the space between the first and second pressing rollers 41 and 42 can be adjusted according to a distance between the first pressing roller 41 and the second pressing roller 42, the elasticities of the first and second dry films 30a and 30b, etc. In order to provide a sufficient pressing power, the pressure applied to the first and second dry films 30a and 30b may be about 10,000 to 200,000 Pa (Pascal), and preferably, 110,000 to 120,000 Pa.

The first pressing roller 41 and/or the second pressing roller 42 may include a heating unit (e.g., a heater) for heating the first pressing roller 41 and/or the second pressing roller 42 to at least a predetermined temperature. Alternatively or in addition, a temperature can be adjusted by controlling the temperature of a process line or a process chamber. The temperature can be determined so that the first organic film 11 of the first dry film 30a and the second organic film 12 of the second dry film 30b are at least partially dissolved or activated and adhere to each other. Thus, the temperature can be appropriately adjusted according to the kinds of the first organic film 11 and the second organic film 12 and the pressing powers of the first and second pressing rollers 41 and 42. For example, the temperature may range from about 70 to 130° C., and preferably from 85 to 95° C. at a pressure of 110,000 to 120,000 Pa.

As a result of the lamination, a multilayer dry film resist in which the first organic film 11, the second organic film 12, and the second base substrate 20 are sequentially formed on the first base substrate 10 is completed. The second base substrate 20 can be used as a cover substrate. If needed, the second base substrate 20, which is the top layer of the multilayer dry film resist, can be removed. After removing the second base substrate 20, a cover substrate may be attached onto the second organic film 12.

Figure 5:
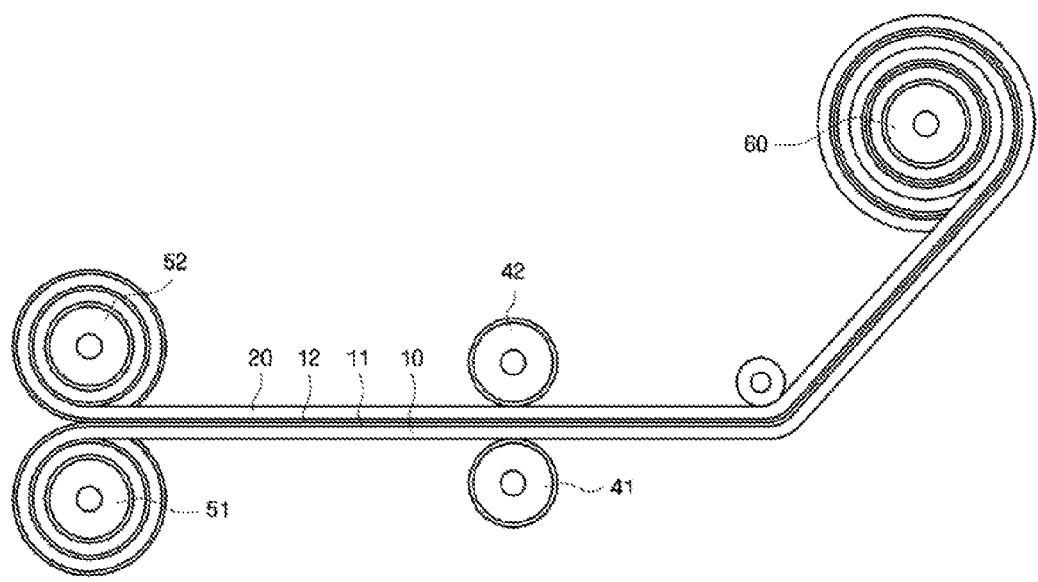

FIG. 5 illustrates a laminator according to some other embodiments of the present invention which can be used in the above-described lamination. Referring to FIG. 5, the laminator further includes first and second uncoiling rollers 51 and 52 and a coiling roller 60, in addition to first and second pressing rollers 41 and 42. First and second dry films 30a and 30b, which are respectively wound around the first and second uncoiling rollers 51 and 52, are unwound from the first and second uncoiling rollers 51 and 52 so that a first organic film 11 and a second organic film 12 face each other. The first and second dry films 30a and 30b are pressed while passing through the first and second pressing rollers 41 and 42 and wound around the coiling roller 60. If needed, a second base substrate 20 may be removed prior to winding around the coiling roller 60, or a cover substrate, instead of the second base substrate 20, may be attached to the second organic, film 12.

A multilayer dry film resist including three or more organic films can be manufactured by repeating the deposition of two dry films as described above, the removal of a top base substrate, and the deposition of a separately prepared dry film on the resultant film structure using a laminator.

Figure 6:
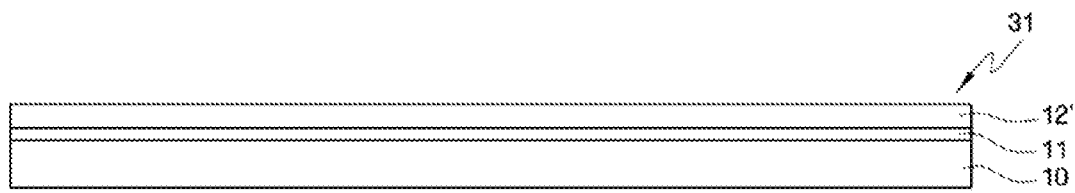
FIG. 6 is a sectional view illustrating a process step of a method of manufacturing a multilayer dry film resist according to another embodiment of the present invention.

Hereinafter, a method of manufacturing a multilayer dry film resist according to another embodiment of the present invention will be described. FIG. 6 is a sectional view illustrating a process step of a method of manufacturing a multilayer dry film resist according to another embodiment of the present invention.

The method of manufacturing the multilayer dry film illustrated in FIG. 6 is substantially the same as illustrated in FIG. 3A in that a first organic film 11 is formed on a base substrate 10 and dried. Further, as illustrated in FIG. 6, a second organic composition including a second organic material, a photosensitizer, and a solvent is coated on the first organic film 11 using, e.g., spin-coating or slit-coating, and dried to form a second organic film 12'. As a result, a multilayer dry film resist 31 in which the second organic film 12' is deposited on the first organic film 11 is completed. If needed, a cover substrate may be attached to the second organic film 12'. Furthermore, in order to form three or more organic films, the above-described processes can be repeated. As described above, a multilayer dry film resist is manufactured using a coating process and a drying process without an additional lamination process, thereby further improving process efficiency.

The above-described multilayer dry film resists according to embodiments of the present invention can be used in the manufacture of display plates for liquid crystal display panels.

Figure 7:
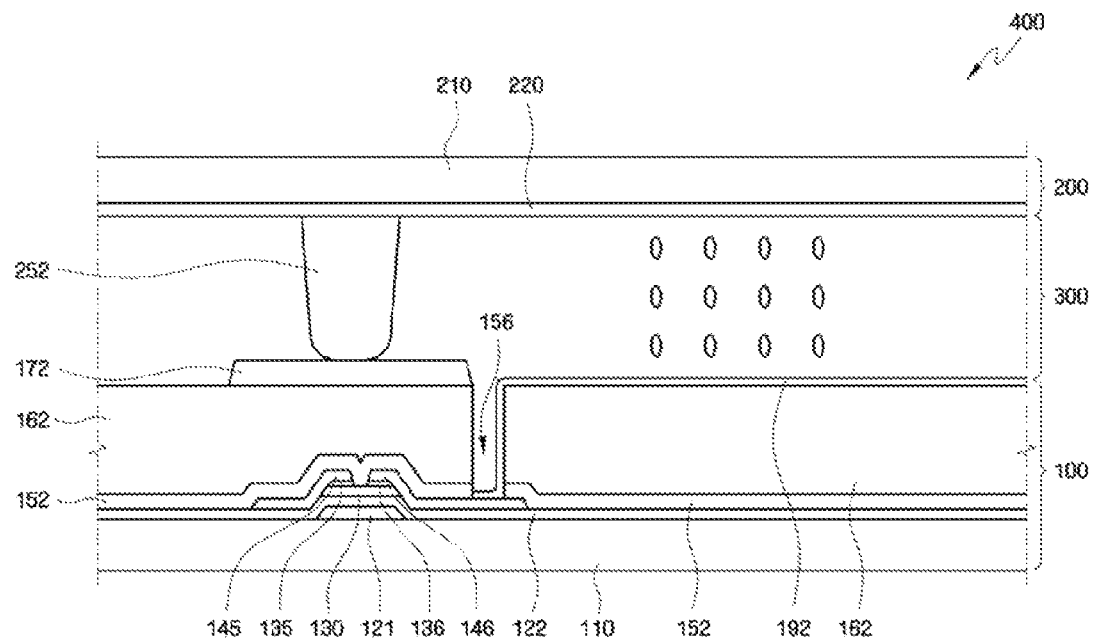
FIG. 7 is a sectional view illustrating a liquid crystal display panel according to an embodiment of the present invention.

FIG. 7 is a sectional view illustrating a liquid crystal display panel according to an embodiment of the present invention. Referring to FIG. 7, a liquid crystal display panel 400 includes a first display plate 100, a second display plate 200 facing the first display plate 100 and a liquid crystal layer 300 interposed between the first display plate 100 and the second display plate 200.

The first display plate 100 includes an array of thin film transistors (TFTs) on a first insulating substrate 110, each TFT including a gate electrode 121, a semiconductor layer 130, a source electrode 145, and a drain electrode 146. The drain electrode 146 is physically and electrically connected to a pixel electrode 192.

The first display plate 100 will now be described in more detail. That is, a gate electrode 121 made of a conductive material is formed on a first insulating substrate 110 made of a transparent glass or plastic material, and a gate insulating layer 122 made of silicon nitride or silicon oxide is stacked on the gate electrode 121.

The semiconductor layer 130 made of hydrogenated amorphous silicon is formed on the gate insulating layer 122. The source electrode 145 made of a conductive material and the drain electrode 146 separated from and opposite to the source electrode 145 relative to the gate electrode 121 are formed over the semiconductor layer 130.

Ohmic contact layers 135 and 136, which are made of silicide or n+ amorphous silicide in which an n-type impurity is highly doped, are formed between the source electrode 145 and the underlying semiconductor layer 130 and between the drain electrode 146 and the underlying semiconductor layer 130. The gate electrode 121, the source electrode 145 and the drain electrode 146 serve as terminals of a thin film transistor, and the semiconductor layer 130 forms a channel portion of the thin film transistor.

A passivation layer 152, which may be made of silicon nitride, etc., is formed on the source electrode 145 and the drain electrode 146. An organic insulating layer 162 including an organic material for forming an organic insulating layer and a photosensitizer is formed on the passivation layer 152. A contact hole 156 partially exposing the drain electrode 146 is formed in the passivation layer 152 and the organic insulating layer 162. The pixel electrode 192 made of a transparent conductive material such as ITO or IZO is formed on an area of the organic insulating layer 162 where there is no thin film transistor formed, for example, as defined by the contact hole 156. The pixel electrode 192 is physically and electrically connected to the drain electrode 146 through the contact hole 156.

A black matrix 172 is disposed on a portion of the organic insulating layer 162 corresponding to a TFT region. The black matrix 172 includes an organic material for a black matrix and a photosensitizer. The black matrix 172 exhibits a black color. For this purpose, the black matrix 172 may further include carbon black. The thickness of the black matrix 172 may be smaller than that of the organic insulating layer 162. For example, if the thickness of the organic insulating layer 162 is about 5 to 6 μm, the thickness of the black matrix 172 may be about 1 to 1.5 μm.

An alignment film (not shown) may be disposed on top of the first display plate 100.

The second display plate 200 is structured such that a common electrode 220 made of a transparent conductive material (e.g., ITO or IZO) is disposed on the entire surface of a second insulating substrate 210 made of transparent glass, plastic, or the like. An alignment film (not shown) may be disposed on top of the second display plate 200 facing the first display plate 100. The second display plate 200 may further include a spacer 252 disposed on the common electrode 220. The spacer 252 maintains a cell gap when the second display plate 200 is disposed to face the first display plate 100.

When the liquid crystal display panel 400 is equipped with polarization plates (not shown), driving modules (not shown), and a backlight assembly (not shown), a liquid crystal display is completed. When the liquid crystal display panel 400 is equipped with a backlight assembly providing white light, black and white images can be displayed. When the liquid crystal display panel 400 is equipped with a backlight assembly providing various color lights such as red light, green light, blue light, etc., color images can be displayed. Various color lights can be provided using a backlight assembly including a light-emitting diode (LED) as a light source.

Hereinafter, a method of manufacturing a liquid crystal display panel as described above will be described, in a case where the structures and materials of intermediate structures, which will be described later, are the same as or can be easily understood from those of the above-described multilayer dry film resists, overlapping descriptions will be omitted or simplified.

A method of manufacturing a first display plate will be described with reference to FIGS. 8A through 14. FIGS. 8A through 14 are sequential sectional views illustrating a method of manufacturing a first display plate for a liquid crystal display panel according to an embodiment of the present invention.

Referring to FIG. 5A, there is provided a first insulating substrate 110 having thereon an array of TFTs, each TFT including a gate electrode 121, a semiconductor layer 130, a source electrode 145, and a drain electrode 146. The first insulating substrate 110 having the TFT array thereon can be prepared using any one of various methods known in the pertinent art, and a detailed description thereof will be omitted.

Figure 8A:
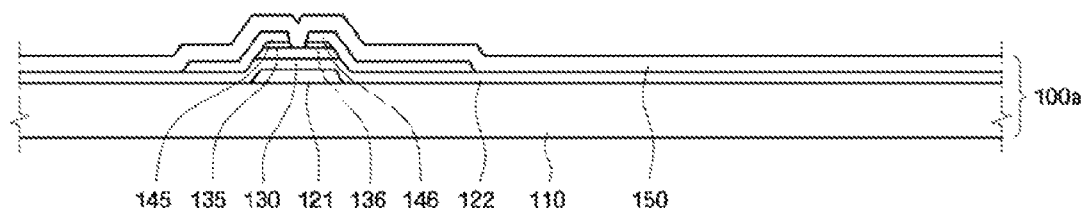
FIGS. 8A through 14 are sequential sectional views illustrating a method of manufacturing a first display plate for a liquid crystal display panel according to an embodiment of the present invention.

Silicon nitride or the like is deposited on the entire surface of the first insulating substrate 110 and the TFT array using chemical vapor deposition (CVD) or the like to form a passivation layer 150. In FIG. 8A, reference numeral 100a refers to a substrate including the passivation layer 150.

Referring to FIG. 5B and FIG. 8A, a multilayer dry film resist 32 is prepared simultaneously with or separately from the provision of the first insulating substrate 110 having thereon the TFT array or the formation of the passivation layer 150. The multilayer dry film resist 32 of the present embodiment includes an organic film 170 for a black matrix and an organic film 160 for an organic insulating layer which are sequentially deposited on the base substrate 10. The organic film 160 for the organic insulating layer includes an organic material for the organic insulating layer and a photosensitizer. The organic film 170 for the black matrix exhibits a black color. For this purpose, the organic film 170 for the black matrix further includes carbon black.

The multilayer dry film resist 32 can be prepared using any one of the above-described methods of manufacturing the multilayer dry film resists according to the embodiments of the present invention, and thus, a detailed description thereof will be omitted.

Figure 8B:
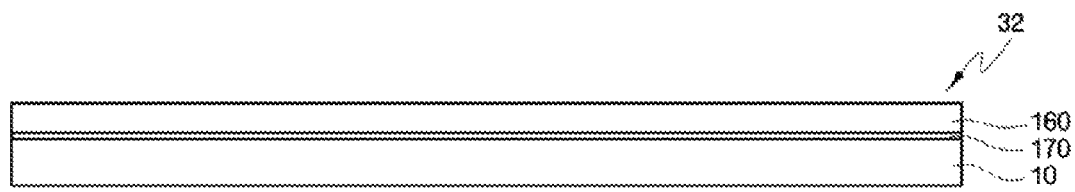
Figure 9:
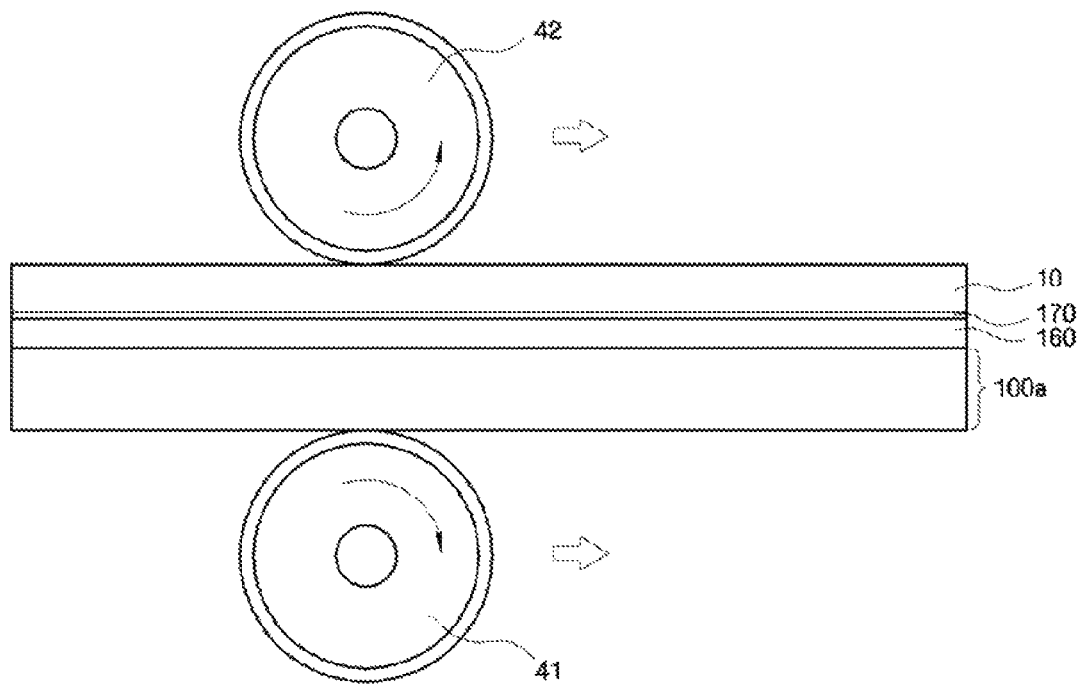

Referring to FIG. 9 and FIGS. 8A and 8B, the multilayer dry film resist 32 is laminated on the substrate 100a including the passivation layer 150 using a laminator. The lamination of the multilayer dry film resist 32 may be performed in substantially the same manner as the lamination using the laminator as illustrated in FIG. 4

The lamination of the multilayer dry film resist 32 may include placing the multilayer dry film resist 32 on the passivation layer 150 so that the organic film 160 for the organic insulating layer faces the passivation layer 150, and passing the resultant structure through a space between first and second pressing rollers 41 and 42. As a result, the multilayer dry film resist 32 is pressed and deposited on the passivation layer 150 so that the organic film 160 for the organic insulating layer, the organic film 170 for the black matrix, and the base substrate 10 are sequentially formed on the passivation layer 150. Here, the rolling speeds of the first and second pressing rollers 41 and 42 or the movement speed of the substrate 100a including the passivation layer 150 and the multilayer dry film resist 32 relative to the first and second pressing rollers 41 and 42 may range from about 0.1 to 2 cm/s, and preferably from 0.7 to 0.9 cm/s. A pressure applied to the substrate 100a including the passivation layer 150 and the multilayer dry film resist 32 when it passes through the space between the first and second pressing rollers 41 and 42 may range from about 10,000 to 200,000 Pa, and preferably from 110,000 to 120,000 Pa. The temperature may range from about 70 to 130° C., and preferably from 85 to 95° C. at a pressure of 110,000 to 120,000 Pa.

Figure 10:
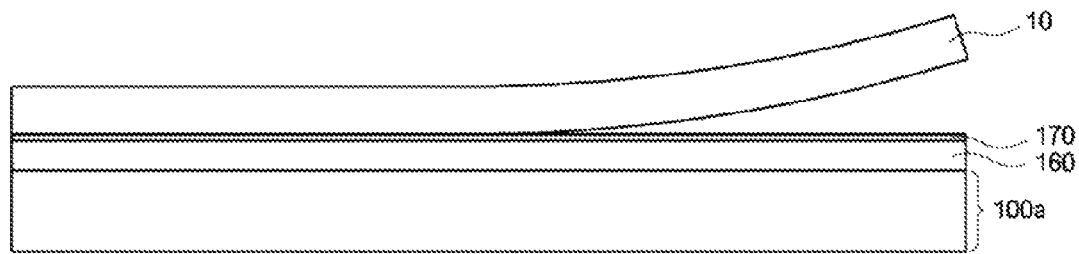

Referring to FIG. 10 and FIG. 9, the base substrate 10 covering the top surface of the substrate 100a including the passivation layer 150 is removed.

According to an embodiment of the present embodiment, the deposition of an organic film for van organic insulating layer and an organic film for a black matrix on a passivation layer can be achieved by performing lamination once without performing a coating process, which is complicated and uses expensive equipment, thereby reducing process costs and improving process efficiency. Furthermore, since a dried film resist is deposited, a dry process and a bake process needed for a coating process can be omitted, thereby minimizing deformation of the first insulating substrate and the TFT array formed on the first insulating substrate due to repeated heat treatments.

Figure 11:
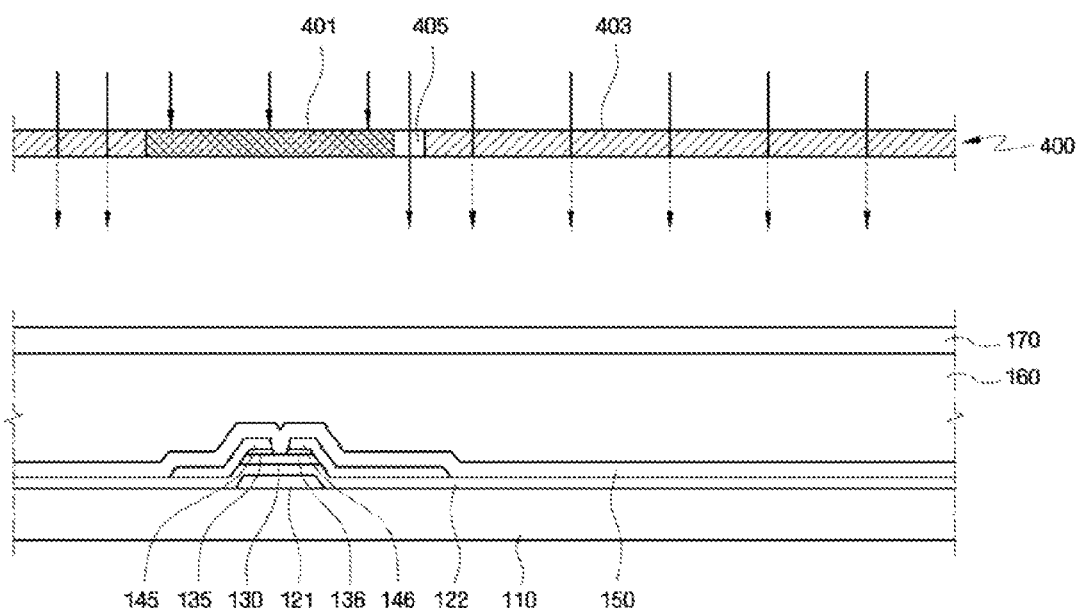

Referring to FIG. 11 and FIG. 10, the organic film 170 for the black matrix and the organic film 160 for the organic insulating layer are patterned. In detail, a mask 400 is placed over the resultant structure including the organic film 160 for the organic insulating layer and the organic film 170 for the black matrix. The mask 400 may be a slit mask or a halftone mask including a light-shielding area 401, a translucent area 403, and a transmissive area 405. The mask 400 is placed over the resultant structure so that the light-shielding area 401 is aligned with the TFT, the translucent area 403 is aligned with a portion of a pixel area, and the transmissive area 405 is aligned with a portion of the drain electrode 146 of the TFT.

The resultant structure is exposed to light and developed. Here, light used in the exposure may be light having a wavelength capable of being transmitted through the organic film 170 for the black matrix having a black color, e.g., UV light. As a result of the exposure and the development, the organic film 170 for the black matrix and the organic, film 160 for the organic insulating layer corresponding to the transmissive area 405 of the mask 400 are removed by a developer, and the organic film 170 for the black matrix and the organic film 160 for the organic insulating layer corresponding to the light-shielding area 401 of the mask 400 remain. The organic film 170 for the black matrix and the organic film 160 for the organic insulating layer corresponding to the translucent area 403 of the mask 400 are partially removed. The organic film 160 for the black matrix can be selectively removed by adjusting the exposure amount.

Figure 12:
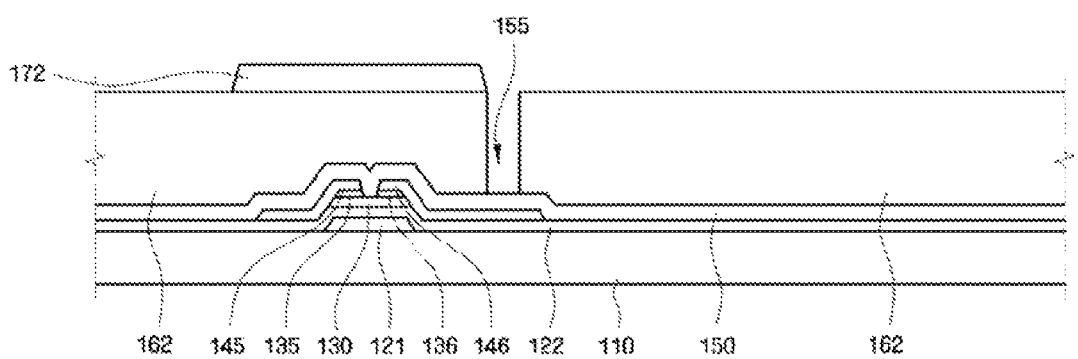

As a result of the patterning, as illustrated in FIGS. 11 and 12, the organic film 160 for the organic insulating layer is left on the entire surface of the first insulating substrate 110 except an exposure area 155 exposing a portion of the passivation layer 150 corresponding to the drain electrode 146, thus forming an organic insulating layer 162. The organic film 170 for the black matrix 172 is left on the organic insulating layer 162 corresponding to the TFT region.

Figure 13:
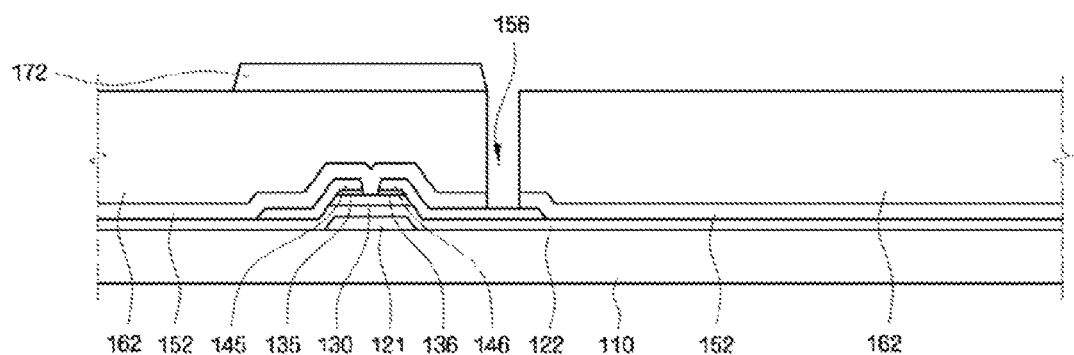

Referring to FIG. 13 and FIG. 12, the exposed portion of the passivation layer 150 is etched using the organic insulating layer 162 as an etching mask to form passivation layer 152. As a result, a contact hole 156 passing through the organic insulating layer 162 and the passivation layer 152 and exposing a portion of the drain electrode 146 is completed.

Figure 14:
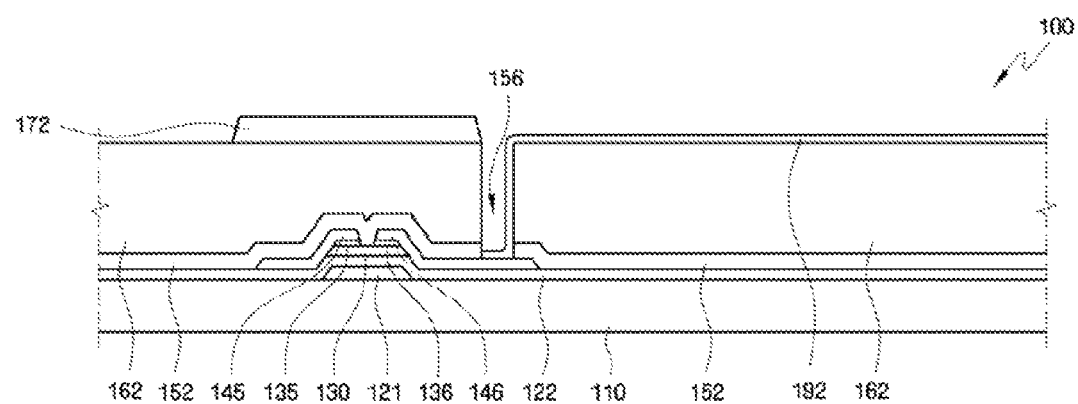

Referring to FIG. 14 and FIG. 13, a transparent conductive material (e.g., ITO or IZO) is deposited on the entire surface of the resultant structure of FIG. 13 using, e.g., sputtering, and then patterned, to form a pixel electrode 192. If needed, an alignment, film (not shown) may be further formed on the top of the resultant structure. This completes a first display plate 100.

Figure 15:
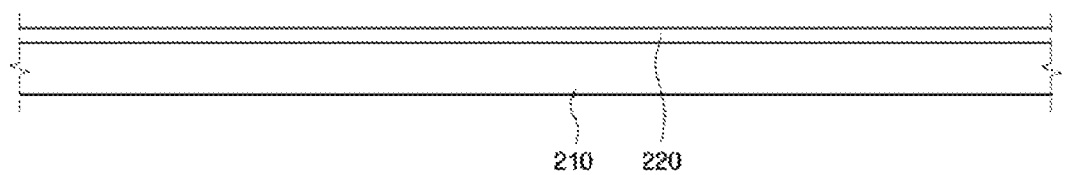
FIGS. 15 and 16 are sequential sectional views illustrating a method of manufacturing a second display plate for a liquid crystal display panel according to an embodiment of the present invention.
Figure 16:
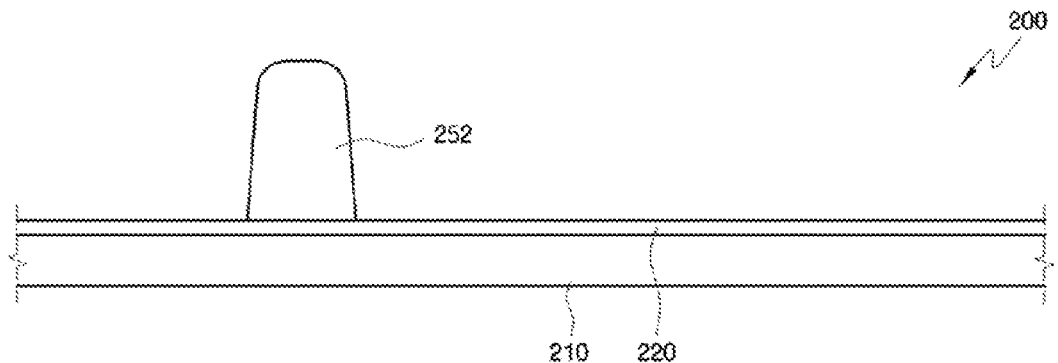

Hereinafter, a method of manufacturing a second display plate will be described with reference to FIGS. 15 and 16. FIGS. 15 and 16 are sequential sectional views illustrating a method of manufacturing a second display plate for a liquid crystal display panel according to an embodiment of the present invention.

Referring to FIG. 15, a transparent conductive material (e.g., ITO or IZO) is deposited on the entire surface of a second insulating substrate 210 using, e.g., sputtering, to form a common electrode 220.

Referring to FIG. 16 and FIG. 15 an organic film for a spacer is deposited on the common electrode 220 and patterned to form a spacer 252. If the organic film for the spacer includes a photosensitizer the spacer 252 can be formed by exposure and development. If the organic film for the spacer includes no photosensitizer, the spacer 252 can be formed using a photolithographic etching process. According to some embodiments of the present invention, a bead spacer may be used. In this case, a patterning process can be omitted. Although not shown, an alignment film may be further formed on the resultant structure of FIG. 15 or 16.

Referring again to FIG. 7, the first display plate 100 and the second display plate 200, which are separately manufactured as described above are disposed to face each other and assembled. At this time, it is preferred that the spacer 252 is aligned with the black matrix 172 of the first display plate 100. The liquid crystal layer 300 may be formed by dropping liquid crystal on the first display plate 100 or the second display plate 200 prior to the assembly of the first display plate 100 and the second display plate 200 or by injecting liquid crystal between the first display plate 100 and the second display plate 200 after the assembly of the first display plate 100 and the second display plate 200. The assembly of the first display plate 100 and the second display plate 200 and the formation of the liquid crystal layer 300 between the first display plate 100 and the second display plate 200 complete the liquid crystal display panel 400.

Figure 17:
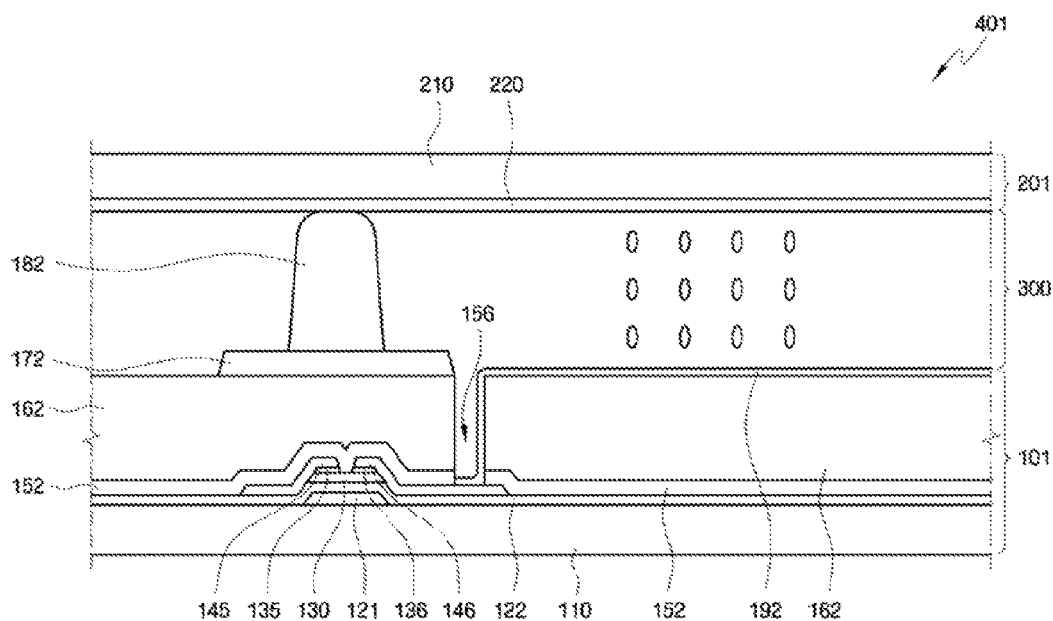
FIG. 17 is a sectional view illustrating a liquid crystal display panel according to another embodiment of the present invention.

FIG. 17 is a sectional view illustrating a liquid crystal display panel according to another embodiment of the present invention. A description of the same structures and functions as the above-described liquid crystal display panel of the previous embodiment of the present invention will be omitted or simplified. Referring to FIG. 17, a liquid crystal display panel 401 differs from the liquid crystal display panel of the embodiment illustrated in FIG. 7 in that a spacer 182 is disposed on a first display plate 101. The spacer 182 is disposed on a black matrix 172 of the first display plate 101. When a second display plate 201 is disposed to face the first display plate 101, an end of the spacer 182 contacts with the common electrode 220 of the second display plate 201.

Hereinafter, a method of manufacturing a liquid crystal display as described above will be described.

FIGS. 18 through 24 are sequential sectional views illustrating a method of manufacturing a first display plate for a liquid crystal display panel according to another embodiment of the present invention.

Figure 18:
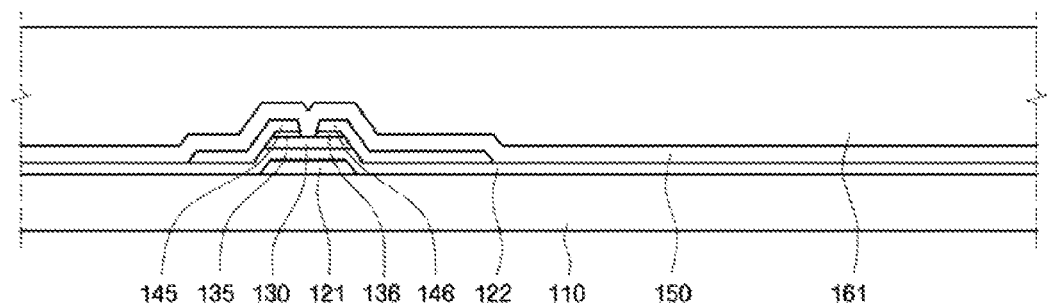
FIGS. 18 through 24 are sequential sectional views illustrating a method of manufacturing a first display plate for a liquid crystal display panel according to another embodiment of the present invention.

Referring to FIG. 18, a first insulting substrate 110 having thereon an army of TFTs, each TFT including a gate electrode 121, a semiconductor layer 130, a source electrode 145, and a drain electrode 146, is prepared, and a passivation layer 150 is formed on the resultant structure.

An organic film 161 for an organic insulating layer is coated on the passivation layer 150 using spin-coating or slit-coating. The organic film 161 is dried and/or baked. Here, the organic film 161 may also be deposited using lamination or the like.

Figure 19:
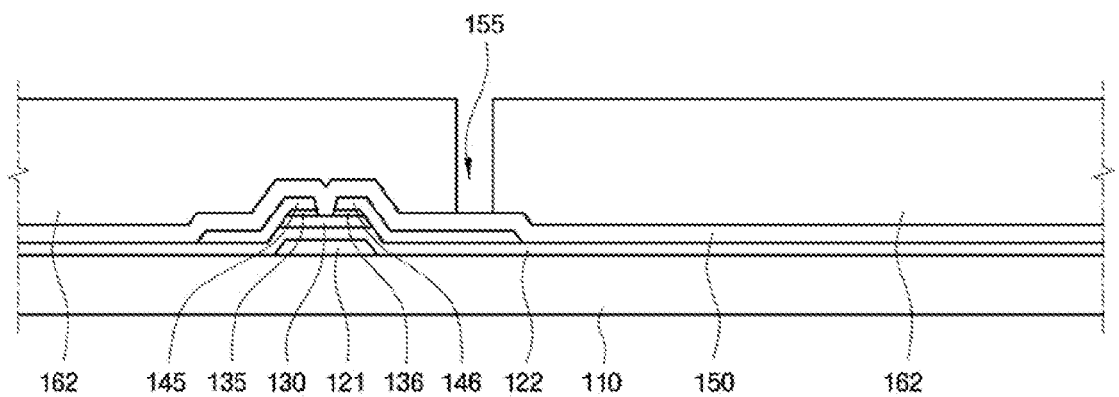

Referring to FIG. 19 and FIG. 18, the organic film 161 for the organic insulating layer is patterned to complete an organic insulating layer 162 including an exposure area 155. If the organic film 161 includes a photosensitizer, the organic film 161 can be patterned by exposure and development. If the organic film 161 includes no photosensitizer, it can be patterned using a photolithography process.

Figure 20:
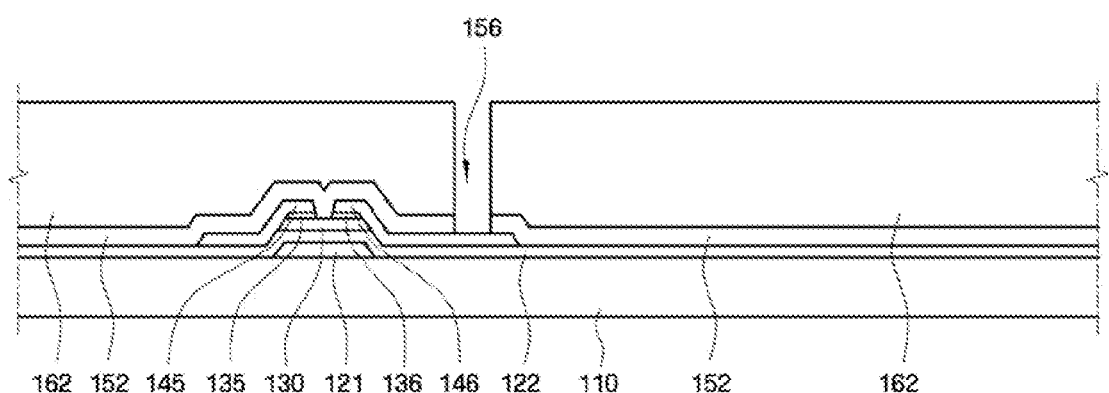

Referring to FIG. 20 and FIG. 19, an exposed portion of the passivation layer 150 is etched using the organic insulating layer 162 as an etching mask forming the passivation layer 152. As a result, a contact hole 156 passing through the organic insulating layer 162 and the passivation layer 152 and exposing a portion of the drain electrode 146 is completed.

Figure 21:
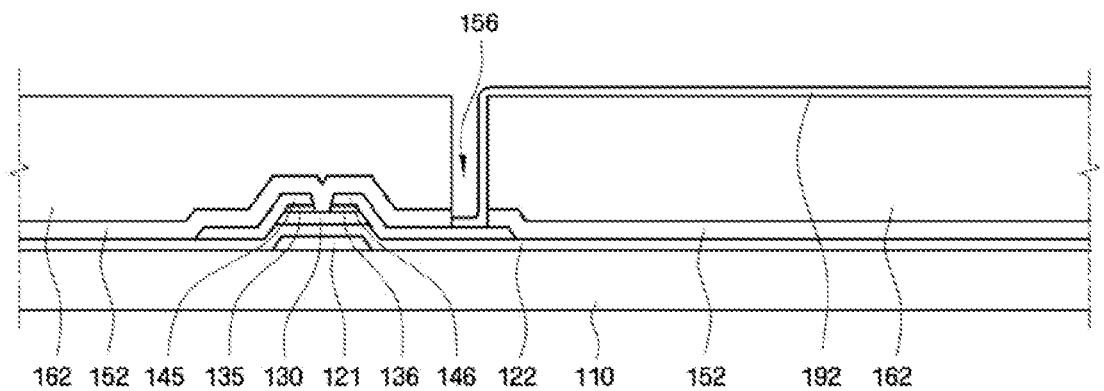

Referring to FIG. 21 and FIG. 20, a transparent conductive material (e.g., ITO or IZO) is deposited on the resultant structure of FIG. 20 using, e.g., sputtering, and patterned to form a pixel electrode 192 covering a portion of a pixel area and being physically and electrically connected to the drain electrode 146.

Figure 22:
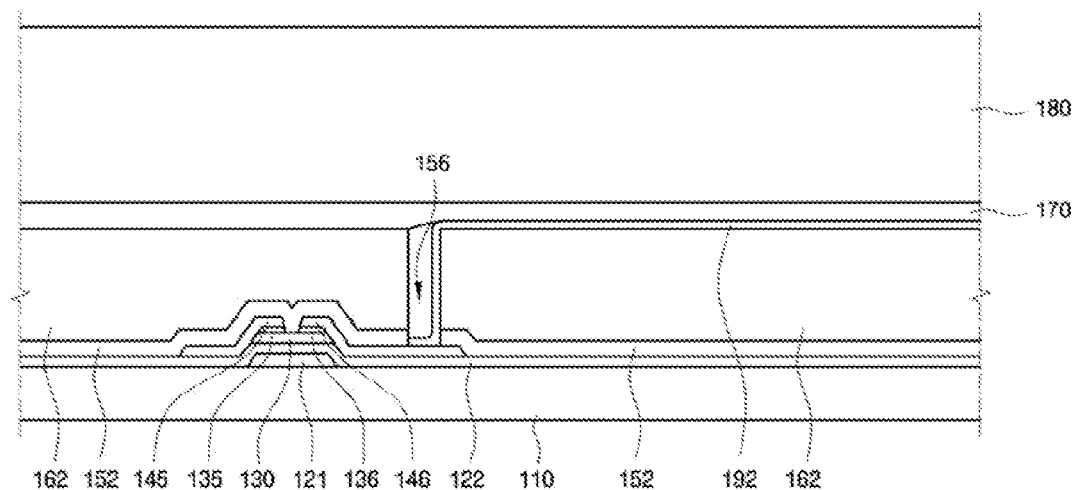

Referring to FIG. 22 and FIG. 21, an organic film 170 for a black matrix and an organic film 180 for a spacer are deposited on the resultant structure of FIG. 21. The deposition of the organic film 170 for the black matrix and the organic film 180 for the spacer may be performed in the same manner as illustrated in FIGS. 8B through 10. A multilayer dry film resist is used, in which the organic film 180 for the spacer and the organic film 170 for the black matrix are sequentially deposited on a base substrate. The organic film 180 for the spacer includes an organic material for the spacer and a photosensitizer. Preferably, the organic material for the spacer may be an elastic organic material.

Figure 23:
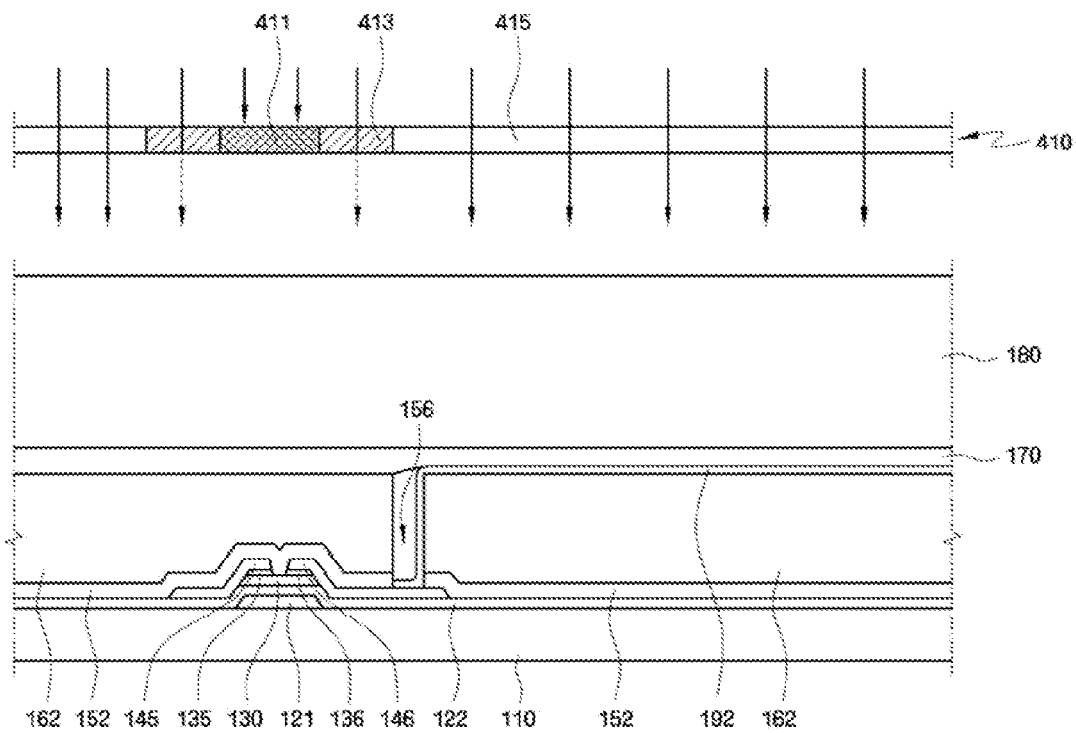
Figure 24:
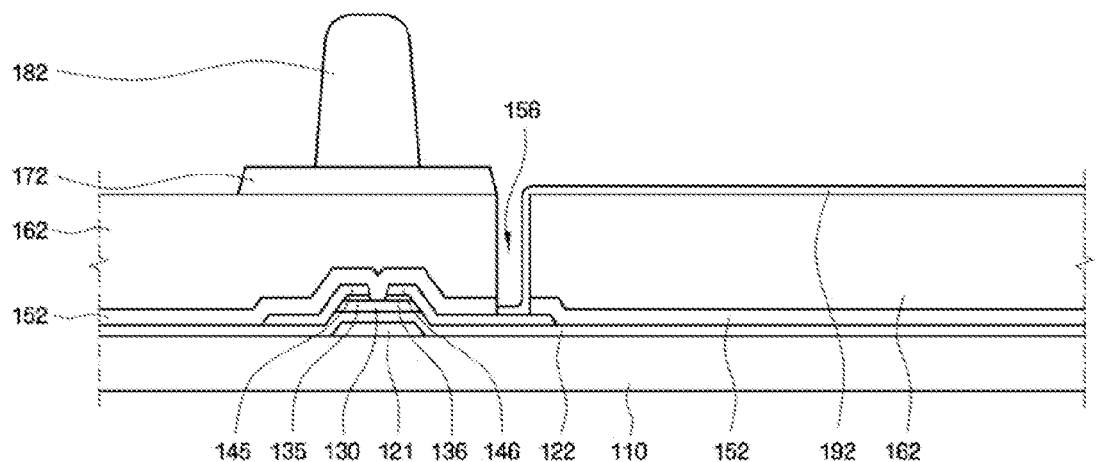

Referring to FIG. 23 and FIG. 22, the organic film 180 for the spacer and the organic film 170 for the black matrix are patterned. That is, as illustrated in FIG. 23, a slit mask or a halftone mask including a light-shielding area 411, a translucent area 413, and a transmissive area 415 is aligned on the resultant structure of FIG. 22, and the resultant structure is exposed and developed. As a result, as illustrated in FIG. 24, a black matrix 172 and a spacer 182 formed on the black matrix 172 are completed. Although not shown, an alignment film may be further formed on the resultant structure of FIG. 24.

FIGS. 25 through 28 are sequential sectional views illustrating a method of manufacturing a first display plate for a liquid crystal display panel according to a further embodiment of the present invention. An organic insulating layer, a black matrix, and a spacer are simultaneously laminated, and simultaneously patterned using a single mask.

Figure 25:
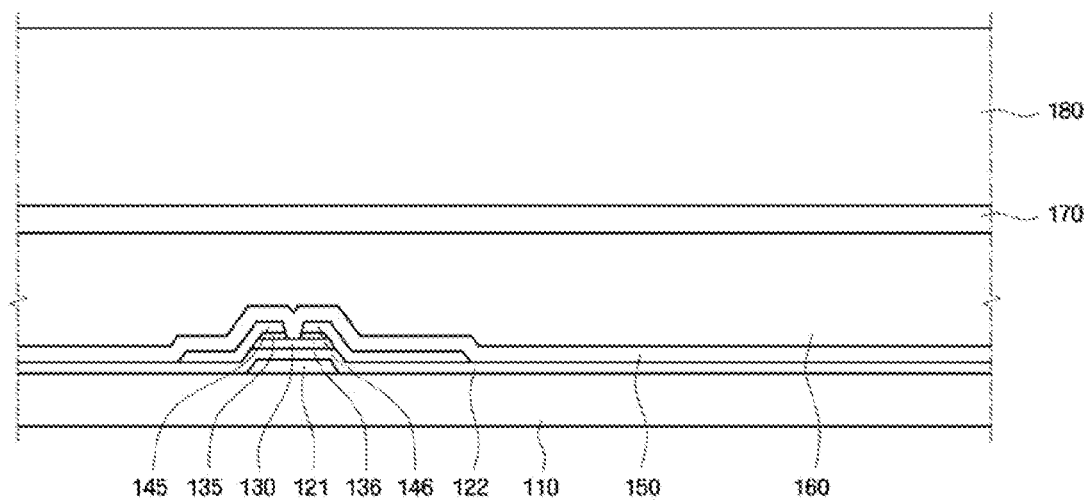
FIGS. 25 through 28 are sequential sectional views illustrating a method of manufacturing a first display plate for a liquid crystal display panel according to a further embodiment of the present invention.

Referring to FIG. 25, a first insulating substrate 110 having thereon an array of TFTs, each TFT including a gate electrode 121, a semiconductor layer 130, a source electrode 145, and a drain electrode 146, is prepared, and a passivation layer 150 is formed on the resultant structure, substantially as illustrated in FIG. 8A. An organic film 160 for an organic insulating layer, an organic film 170 for a black matrix, and an organic film 180 for a spacer are deposited on the passivation layer 150. The deposition of the organic film 160 for the organic insulating layer, the organic film 170 for the black matrix, and the organic film 180 for the spacer may be performed in substantially the same manner as illustrated in FIGS. 8B through 10 except that a multilayer dry film resist is used, in which three organic films, i.e., the organic film 180 for the spacer, the organic film 170 for the black matrix, and the organic film 160 for the organic insulating layer, are deposited on a base substrate.

Figure 26:
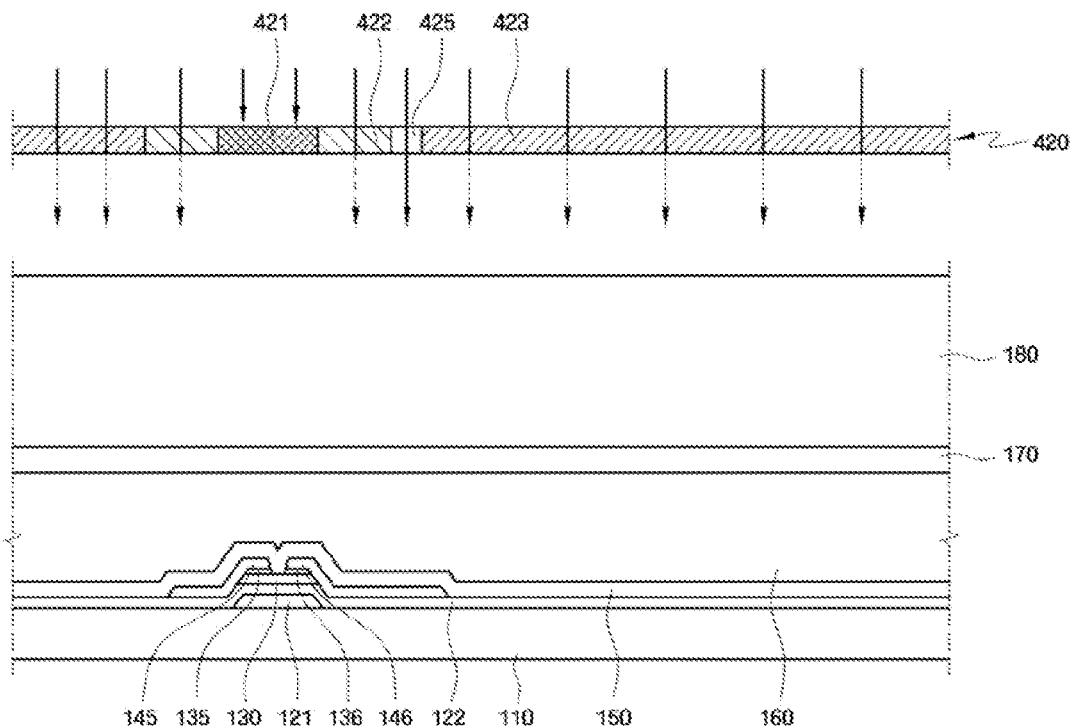

Referring to FIG. 26 and FIG. 25 the organic film 180 for the spacer, the organic film 170 for the black matrix, and the organic film 160 for the organic insulating layer are patterned. As illustrated in FIG. 26, a mask 420 (e.g., a slit mask or a halftone mask) including a light-shielding area 421, a first translucent area 422, a second translucent area 423, and a transmissive area 425 is aligned on the resultant structure of FIG. 25, and the resultant structure is exposed and developed. The exposure light transmittance of the first translucent area 422 is lower than that of the second translucent area 423. Thus, as a result of the exposure and development, the organic film 180 for the spacer, the organic film 170 for the black matrix, and the organic film 160 for the organic insulating layer corresponding to the transmissive area 425 are removed by a developer, whereas the organic film 180 for the spacer, the organic film 170 for the black matrix, and the organic film 160 for the organic insulating layer corresponding to the light-shielding area 421 remain. The organic film 180 for the spacer, the organic film 170 for the black matrix, and the organic film 160 for the organic insulating layer corresponding to the first and second translucent areas 422 and 423 are partially removed. By adjusting the exposure amount, the organic film 180 for the spacer corresponding to the first translucent area 422 can be selectively removed, the underlying organic film 170 for the black matrix and the organic, film 160 for the organic insulating layer can be left, the organic film 180 for the spacer and the organic film 170 for the black matrix corresponding to the second translucent area 423 can be selectively removed, and the underlying organic film 160 for the organic insulating layer can be left.

Figure 27:
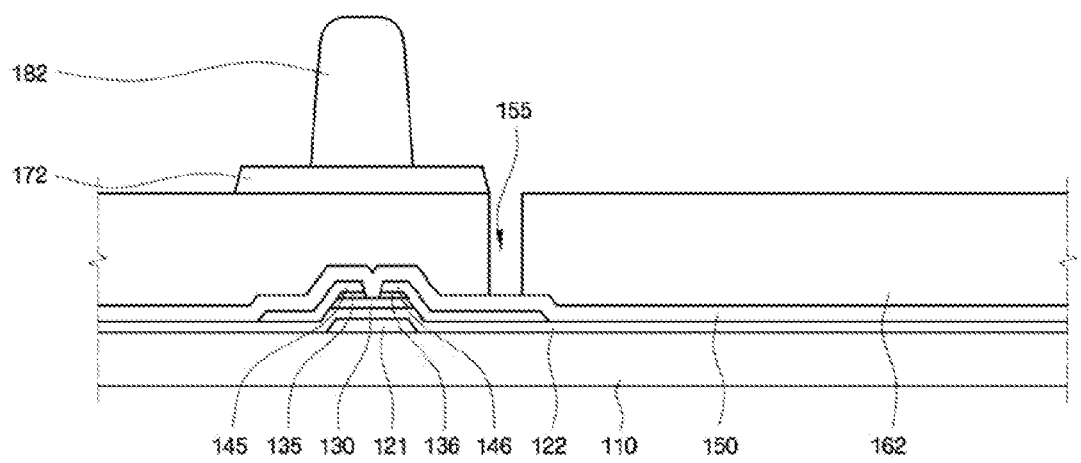

As a result of the patterning, as illustrated in FIGS. 26 and 27, the organic film 160 for the organic insulating layer is left on the entire surface of the first insulating substrate 110 except for an exposure area 155 exposing the passivation layer 150 corresponding to a portion of the drain electrode 146, thereby forming an organic insulating layer 162; the organic film 170 for the black matrix is left on the organic insulating layer 162 corresponding to a TFT region thereby forming a black matrix 172; and the organic film 180 for the spacer is left on the black matrix 172 thereby forming a spacer 182.

Figure 28:
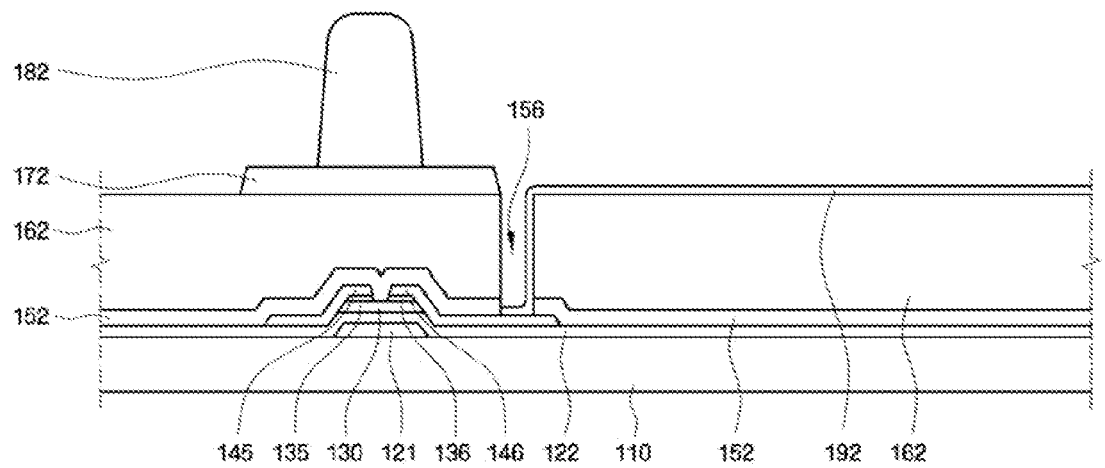

Referring to FIG. 28 and FIG. 27, an exposed portion of the passivation layer 150 is etched to complete a contact hole 156 passing through the organic insulating layer 162 and through the passivation layer 152. A transparent conductive material (e.g., ITO or IZO) is deposited on the resultant structure of FIG. 28 and patterned to form a pixel electrode 192. Although not shown, an alignment film may be further formed on the resultant structure of FIG. 28. An organic film, an organic film for a black matrix, and a spacer can be deposited by performing lamination once without performing a coating process, which is complex and uses expensive equipment. Furthermore, patterning can be performed using a single mask, thereby further improving process efficiency.

The first display plate 101 for the liquid crystal display panel 401 illustrated in FIG. 17 may also be manufactured by a combination of above-described embodiments. For example, the first display plate 101 can be completed by laminating an organic film for a black matrix and an organic film for a spacer on an organic film for an organic insulating layer after the process of FIG. 18 and performing the processes of FIGS. 26 through 28.

Referring again to FIG. 17, the second display plate 201 can be manufactured in substantially the same manner as illustrated in FIGS. 15 and 16. The assembly of the first display plate 101 and the second display plate 201 and the formation of a liquid crystal layer 300 can be performed in substantially the same manner as described above with reference to FIG. 7.

No spacer is formed on a second display plate (see FIG. 17), and thus, the number of heat treatments applied to a second insulating substrate (see 210 of FIG. 17) is reduced. Thus, even when a glass substrate with a high thermal expansion coefficient, e.g., a soda lime glass substrate, is used as the second insulating substrate, the degree of deformation of the substrate due to heat treatment can be reduced, thereby making it possible to use various kinds of substrate materials for the second insulating substrate.

Figure 29:
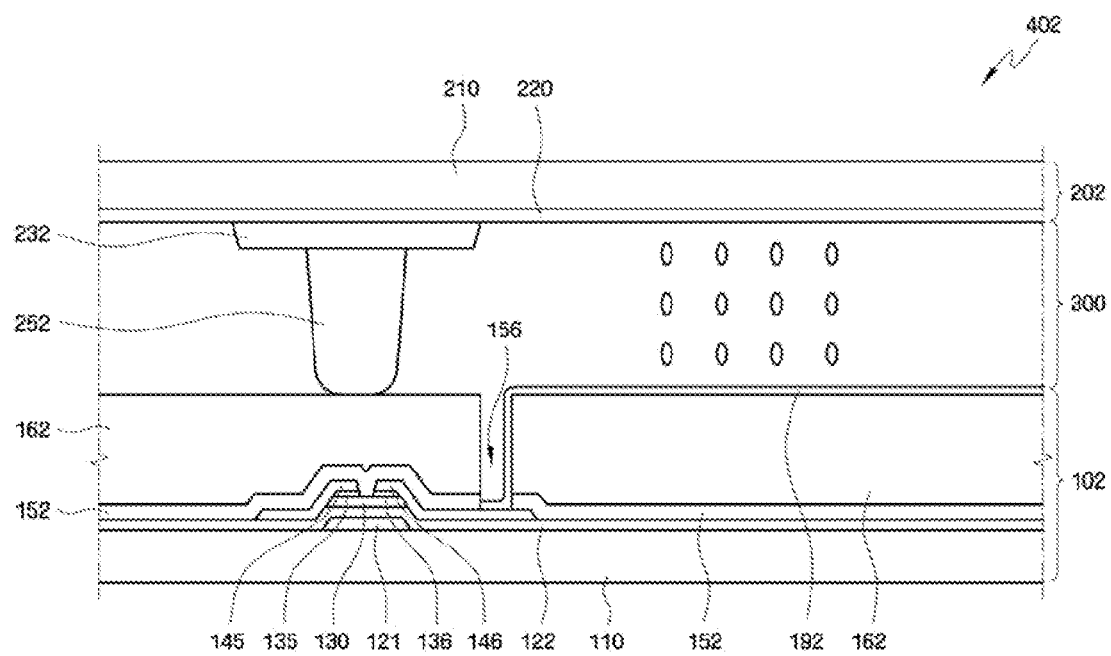
FIG. 29 is a sectional view illustrating a liquid crystal display panel according to still another embodiment of the present invention.

FIG. 29 is a sectional view illustrating a liquid crystal display panel according to still another embodiment of the present invention. A description of the same structures and functions as the above-described liquid crystal display panel(s) will be omitted or simplified.

Referring to FIG. 29, a first display plate 102 of a liquid crystal display panel 402 is substantially the same as the first display plate 100 of FIG. 7 except that no black matrix is formed. With respect to a second display plate 202, a common electrode 220 is disposed on a second insulating substrate 210, and a black matrix 232, which is derived from an organic film for a black matrix, is disposed on the common electrode 220. A spacer 252 is disposed on the black matrix 232.

Figure 30:
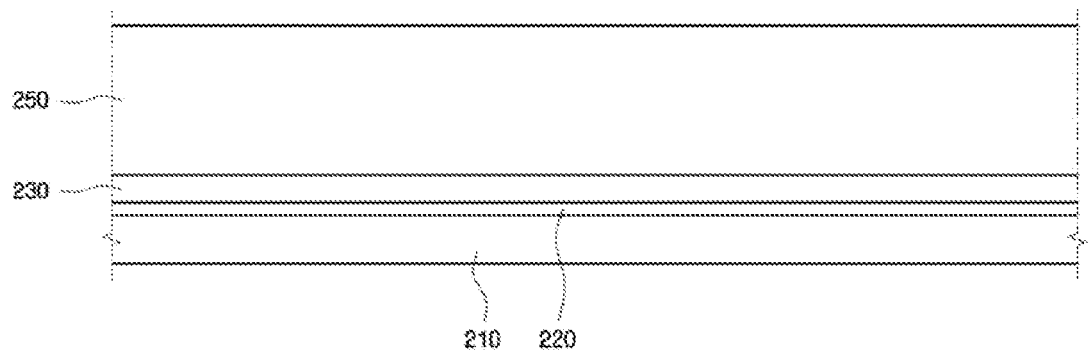
FIGS. 30 through 32 are sequential sectional views illustrating a method of manufacturing a second display plate for a liquid crystal display panel according to still another embodiment of the present invention.
Figure 31:
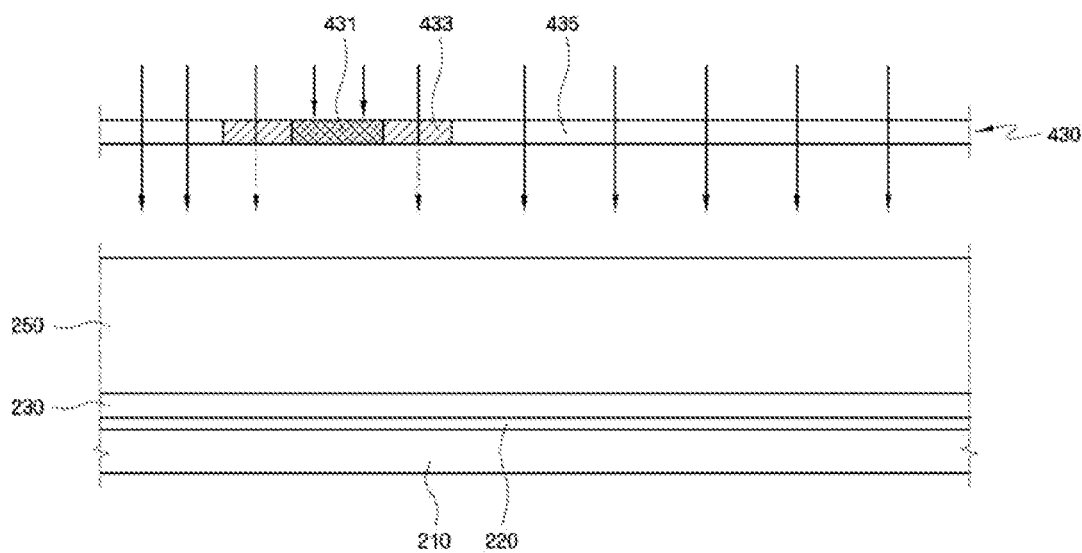
Figure 32:
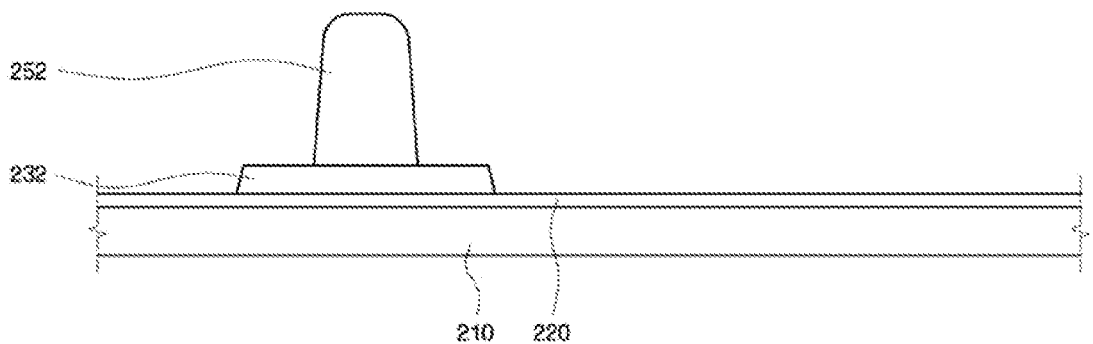

The method of manufacturing the first, display plate 102 can be understood from FIGS. 8A through 14 and FIGS. 18 through 28, and thus, a detailed description thereof will be omitted. Hereinafter, a method of manufacturing the second display plate 202 will be described with reference to FIGS. 30 through 32. FIGS. 30 through 32 are sequential sectional views illustrating a method of manufacturing a second display plate for a liquid crystal display panel according to still another embodiment of the present invention.

Referring to FIG. 30, the formation of a common electrode 220 on a second insulating substrate 210 is performed in substantially the same manner as illustrated in FIG. 15. An organic film 230 for a black matrix and an organic film 250 for a spacer are deposited on the common electrode 220. The formation of the organic film 230 for the black matrix and the organic film 250 for the spacer may be performed in substantially the same manner as illustrated in FIGS. 8B through 10. A multilayer dry film resist is used, in which the organic film 250 for the spacer and the organic film 230 for the black matrix are sequentially deposited on a base substrate.

Referring to FIG. 31 and FIG. 30, the organic film 250 for the spacer and the organic film 230 for the black matrix are patterned. As illustrated in FIG. 31, a mask 430 (e.g., a slit mask or a halftone mask) including a light-shielding area 431, a translucent area 433, and a transmissive area 435 is aligned on the resultant structure of FIG. 30, and the resultant structure is exposed and developed. As a result, as illustrated in FIG. 32, a black matrix 232 and a spacer 252 disposed on the black matrix 232 are completed. Although not shown, if needed, an alignment film may be further formed on the resultant structure of FIG. 32 to complete a second display plate (see 202 of FIG. 29).

An organic film for a black matrix and an organic film for a spacer are deposited on a common electrode by performing lamination once without performing a coating process, which is complicated and uses expensive equipment, thereby improving process efficiency.

Figure 33:
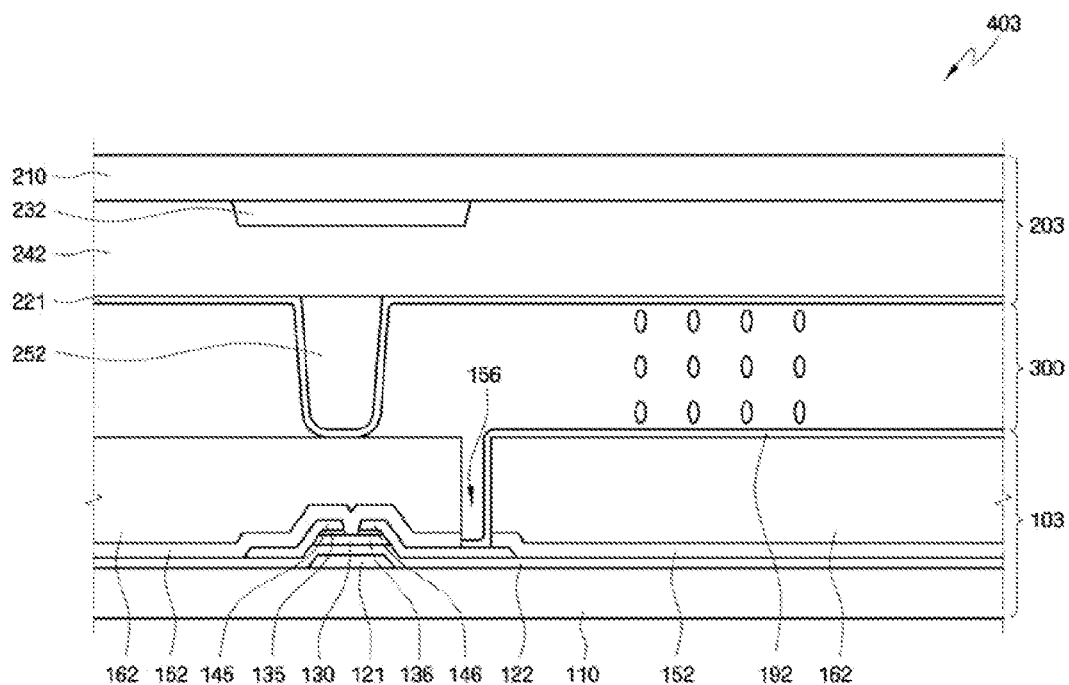
FIG. 33 is a sectional view illustrating a liquid crystal display panel according to yet another embodiment of the present invention.

FIG. 33 is a sectional view illustrating a liquid crystal display panel according to yet another embodiment of the present invention. A description of the same structures and functions as the above-described liquid crystal display panel(s) will be omitted or simplified.

Referring to FIG. 33, a first display plate 103 for a liquid crystal display panel 403 of the present embodiment is substantially the same as the first display plate 102 illustrated in FIG. 29.

With respect to a second display plate 203, a black matrix 232 is disposed on a second insulating substrate 210. The black matrix 232 is covered with an overcoating layer 242 and a spacer 252 is disposed on the overcoating layer 242. A common electrode 221 is disposed on the overcoating layer 242 and the spacer 252 to cover the overcoating layer 242 and the spacer 252.

A method of manufacturing the first display plate 103 can be understood from FIGS. 8A through 14 and FIGS. 18 through 28, and thus, a detailed description thereof will be omitted. Hereinafter, a method of manufacturing the second display plate 203 will be described with reference to FIGS. 34 through 37. FIGS. 34 through 37 are sequential sectional views illustrating a method of manufacturing a second display plate for a liquid crystal display panel according to yet another embodiment of the present invention.

Figure 34:
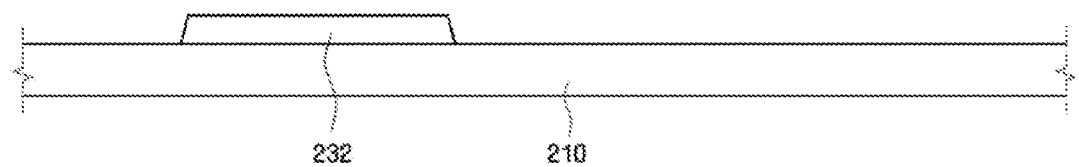
FIGS. 34 through 37 are sequential sectional views illustrating a method of manufacturing a second display plate for a liquid crystal display panel according to yet another embodiment of the present invention.

Referring to FIG. 34, an organic film for a black matrix is deposited on a second insulating substrate 210 and patterned to form a black matrix 232. In detail, the organic film for the black matrix is deposited on the second insulating substrate 210 using slit-coating, spin-coating, lamination, or the like. If the organic film for the black matrix includes a photosensitizer, the black matrix 232 can be formed by patterning using exposure and development. If the organic film for the black matrix includes no photosensitizer, the black matrix 232 can be formed by patterning using a photolithography process.

Figure 35:
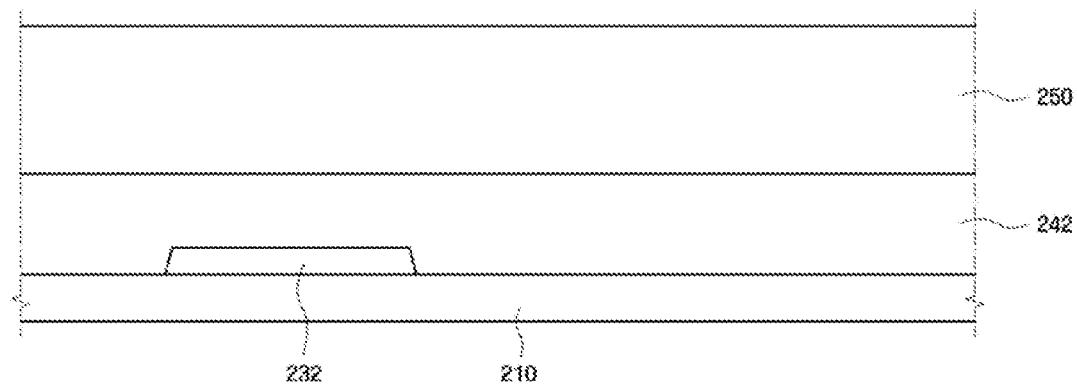

Referring to FIG. 35 and FIG. 34, an overcoating layer 242 and an organic film 250 for a spacer are deposited on the second insulating substrate 210 having thereon the black matrix 232. The deposition of the overcoating layer 242 and the organic film 250 for the spacer can be performed in substantially the same manner as illustrated in FIGS. 8B through 10. A multilayer dry film resist is used in which the organic film 250 for the spacer and the overcoating layer 242 are sequentially deposited on a base substrate. The overcoating layer 242 includes an organic material for overcoat having good planarity. The overcoating layer 242 may not include a photosensitizer since there is no need to pattern the overcoating layer 242.

The organic film 250 for the spacer is patterned by exposure and development. As a result, as illustrated in FIG. 36, a spacer 252 is formed on the overcoating layer 242

Figure 36:
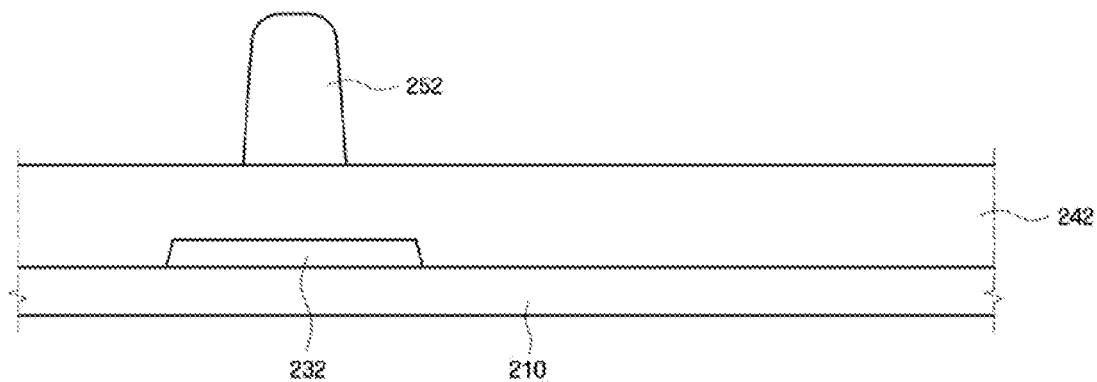
Figure 37:
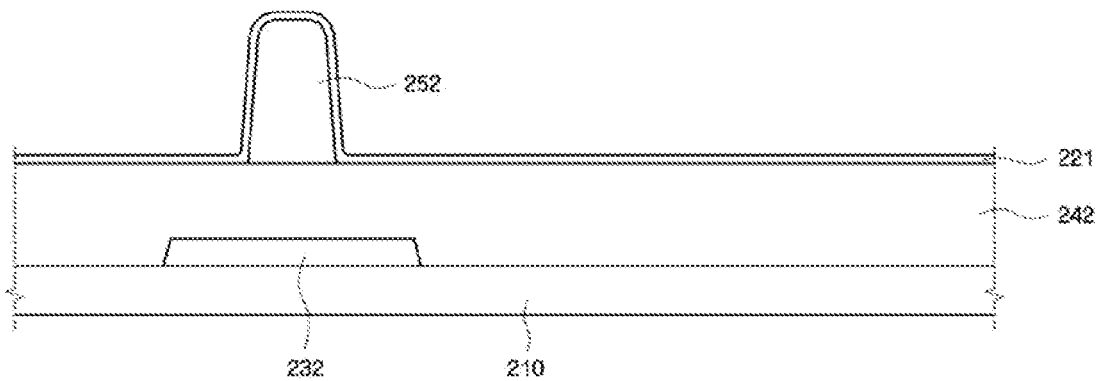

Referring to FIG. 37 and FIG. 36, a transparent conductive material (e.g., ITO or IZO) is deposited on the entire surface of the resultant structure of FIG. 36 using, e.g., sputtering, to form a common electrode 221. If needed, an alignment film (not shown) may be further formed on the resultant structure to complete a second display plate (see 203 of FIG. 33).

An overcoating layer and an organic film for a spacer are deposited on a black matrix by performing lamination once without performing a coating process, which is complicated and uses expensive equipment, thereby improving process efficiency. Furthermore, the overcoating layer formed by the lamination does not have surface distortion which may be caused by spin coating, thereby further enhancing planarity.

Figure 38:
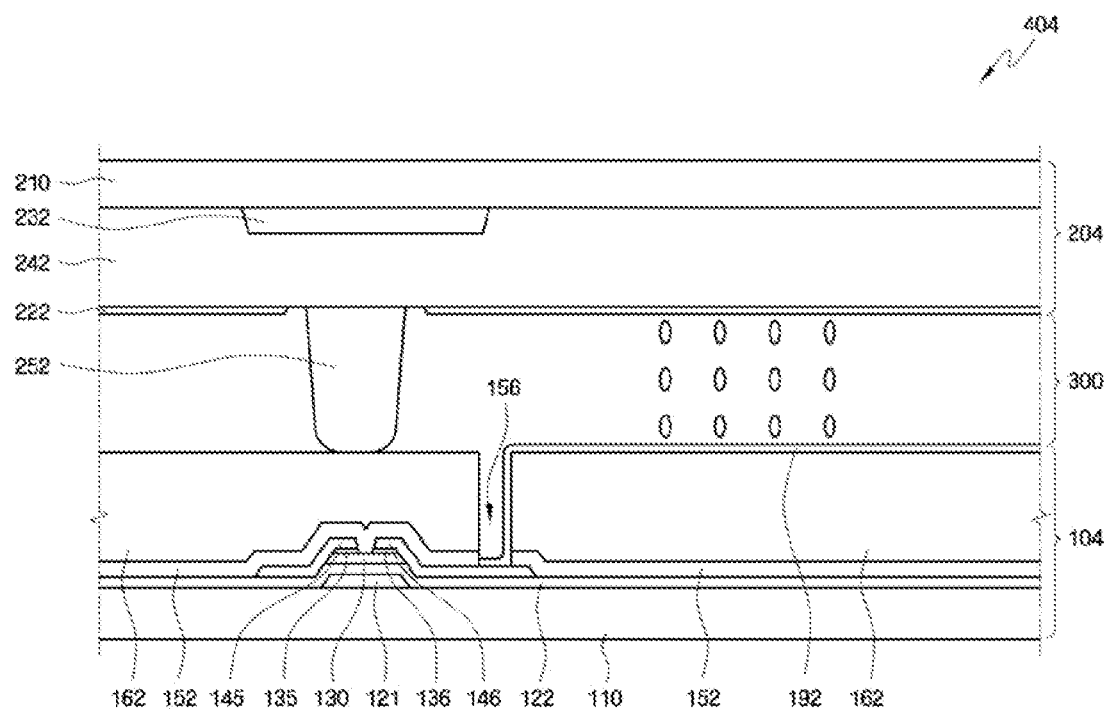
FIG. 38 is a sectional view illustrating a liquid crystal display panel according to a further embodiment of the present invention.

FIG. 38 is a sectional view illustrating a liquid crystal display panel according to a further embodiment of the present invention.

Referring to FIG. 38, a liquid crystal display panel 404 differs from the liquid crystal display panel 403 illustrated in FIG. 33 in that a common electrode 222 of a second display plate 204 is not present on a surface of a spacer 252. For this purpose, the manufacture of the second display plate 204 further includes patterning a film for the common electrode 222 after forming the film for the common electrode 222. Since no electrode capable of causing electric field distortion is present on a surface of the spacer 252, liquid crystal molecules can be precisely controlled. In particular, the process of FIG. 38 can be applied to a patterned vertically aligned (PVA) mode since a common electrode on a surface of a spacer can be removed simultaneously with patterning the common electrode to define domains.

Multilayer dry film resists according to embodiments of the present invention can be usefully applied in the manufacture of display plates for liquid crystal display panels.

In methods of manufacturing multilayer dry film resists according to embodiments of the present invention, dry films can be formed by solvent removal using heat treatment and lamination without performing a vacuum dry process and a bake process, thereby simplifying a manufacturing process.

In methods of manufacturing display plates for liquid crystal display panels according to embodiments of the present invention, two or more organic films can be deposited by performing lamination once without performing a coating process, thereby reducing process costs and improving process efficiency.

While the present invention has been particularly shown and described with reference to exemplary embodiments thereof it will be understood by those of ordinary skill in the art that various changes in form and details may be made therein without departing from the spirit and scope of the present invention. It is therefore desired that exemplary embodiments be considered in all respects as illustrative and not restrictive.

What is claimed is:

1. A method of manufacturing a display plate for a liquid crystal display panel, the method comprising:
   forming a passivation layer on an insulating substrate on which a plurality of thin film transistors are arranged, each thin film transistor comprising a gate electrode, a semiconductor layer, a source electrode, and a drain electrode;
   placing and laminating on the passivation layer a multilayer dry film resist comprising a base substrate, a first organic film comprising an organic material and a first photosensitizer formed on the base substrate, and a second organic film comprising an organic material and a second photosensitizer formed on the first organic film so that the second organic film faces the passivation layer;
   removing the base substrate; and
   patterning, simultaneously, the first organic film and the second organic film to form a black matrix and an organic insulating layer, respectively.

2. The method of claim 1, wherein the first organic film comprises the organic material for the black matrix and the first photosensitizer and the second organic film comprises the organic material for the organic insulating layer and the second photosensitizer,
   wherein in the patterning of the first organic film and the second organic film, the first organic film and the second organic film are exposed using a mask having a transmissive area, a translucent area, and a light-shielding area and developed to respectively form the black matrix and the organic insulating layer comprising an exposure area exposing a portion of the passivation layer, and after the patterning of the first organic film and the second organic film, further comprising forming a pixel electrode which is connected to the drain electrode through the exposure area.

3. The method of claim 1,
wherein the multilayer dry film resist further comprises a third organic film comprising an organic material for a spacer and a third photosensitizer,
wherein in the patterning of the first organic film and the second organic film further comprises patterning the third organic film,
wherein the first organic film, the second organic film and third organic film are exposed using a mask having a transmissive area, a translucent area, and a light-shielding area and developed to respectively form the black matrix, the organic insulating layer including an exposure area exposing a portion of the passivation layer and the spacer,
the method further comprising forming a pixel electrode which is connected to the drain electrode through the exposure area.

4. The method of claim 1, wherein the lamination is performed using a laminator comprising a pressing roller, and
wherein in the lamination, a rolling speed of the pressing roller is about 0.1 to 2 cm/s, a temperature is about 70 to 130° C., and a pressure applied to the insulating substrate and the multilayer dry film resist by the pressing roller is about 10,000 to 200,000 Pa.

5. The method of claim 1, wherein the multilayer dry film resist further comprises a third organic film formed on the first organic film so that the first organic film faces the passivation layer, and wherein patterning further includes patterning the third organic film.

6. A method of manufacturing a display plate for a liquid crystal display panel, the method comprising:
placing and laminating on an insulating substrate a multilayer dry film resist comprising a base substrate, a first organic film formed on the base substrate, and a second organic film formed on the first organic film so that the second organic film faces the insulating substrate;
removing the base substrate; and
patterning the first organic film to form a spacer,
wherein the first organic film comprises an organic material for the spacer and a photosensitizer and the second organic film is an overcoating film, wherein the overcoating film is not patterned,
prior to the placement of the multilayer dry film resist on the insulating substrate, further comprising forming a black matrix on the insulating substrate, wherein the black matrix is covered by the overcoating film,
wherein in the patterning of the first organic film, the first organic film is exposed using a mask having a transmissive area and a light-shielding area and developed to be the spacer, and
after the patterning of the first organic film, further comprising forming a common electrode on the overcoating film and on the spacer, wherein the spacer maintains a cell gap in which a liquid crystal layer is disposed.

7. The method of claim 6, wherein the formation of the common electrode comprises:
forming a transparent conductive material layer on the overcoating film and on the spacer; and
removing the transparent conductive material layer on the spacer.

8. The method of claim 6, wherein the lamination is performed using a laminator comprising a pressing roller, and
wherein in the lamination, a rolling speed of the pressing roller is about 0.1 to 2 cm/s, a temperature is about 70 to 130° C., and a pressure applied to the insulating substrate and the multilayer dry film resist by the pressing roller is about 10,000 to 200,000 Pa.

9. A method of manufacturing a display plate for a liquid crystal display panel, the method comprising:
placing and laminating on an insulating substrate a multilayer dry film resist comprising a base substrate, a first organic film comprising an organic material and a first photosensitizer formed on the base substrate, and a second organic film comprising an organic material and a second photosensitizer formed on the first organic film so that the second organic film faces the insulating substrate;
removing the base substrate; and
patterning, simultaneously, the first organic film and the second organic film to form a black matrix and an organic insulating layer, respectively.

10. The method of claim 9, wherein the first organic film comprises an organic material for a spacer and a first photosensitizer and the second organic film comprises an organic material for the black matrix and a second photosensitizer,
prior to the placement of the multilayer dry film resist on the insulating substrate, further comprising forming the common electrode on the insulating substrate, and
wherein in the patterning of the first organic film, the first organic film and the second organic film are exposed using a mask having a transmissive area, a translucent area, and a light-shielding area and developed to respectively form the spacer and the black matrix.

* * * * *